(12) United States Patent
Chowdhury et al.

(10) Patent No.: US 9,707,741 B2
(45) Date of Patent: *Jul. 18, 2017

(54) GLASS-PLASTIC LAMINATE DEVICE, PROCESSING LINE AND METHODS THEREFOR

(75) Inventors: Dipakbin Qasem Chowdhury, Corning, NY (US); Kurt Edward Gerber, Dansville, NY (US); Kiat Chyai Kang, Painted Post, NY (US); Yu Xiao, Pittsford, NY (US)

(73) Assignee: Corning Incorporated, Corning, NY (US)

( * ) Notice: Subject to any disclaimer, the term of this patent is extended or adjusted under 35 U.S.C. 154(b) by 627 days.

This patent is subject to a terminal disclaimer.

(21) Appl. No.: 14/118,781

(22) PCT Filed: May 15, 2012

(86) PCT No.: PCT/US2012/037911
§ 371 (c)(1),
(2), (4) Date: Jan. 30, 2014

(87) PCT Pub. No.: WO2012/166343
PCT Pub. Date: Dec. 6, 2012

(65) Prior Publication Data
US 2014/0132132 A1 May 15, 2014

Related U.S. Application Data

(60) Provisional application No. 61/490,976, filed on May 27, 2011.

(51) Int. Cl.
*B32B 3/28* (2006.01)
*B65H 20/02* (2006.01)
(Continued)

(52) U.S. Cl.
CPC ............ *B32B 17/1055* (2013.01); *B32B 3/28* (2013.01); *B32B 17/064* (2013.01); *B65H 20/02* (2013.01);
(Continued)

(58) Field of Classification Search
CPC ..... B32B 3/28; B32B 17/064; B32B 17/1055; B32B 2250/02; B32B 2250/03;
(Continued)

(56) References Cited

U.S. PATENT DOCUMENTS

| | | | |
|---|---|---|---|
| 3,089,801 A | 5/1963 | Tierney et al. | 154/47 |
| 3,391,053 A | 7/1968 | Kolb | 161/185 |

(Continued)

FOREIGN PATENT DOCUMENTS

| | | |
|---|---|---|
| CN | 1602122 | 3/2005 |
| CN | 101080121 | 11/2007 |

(Continued)

OTHER PUBLICATIONS

Ma et al.; Mechanics of rollable and foldable film-on-foil electronics; Applied Physics Letters; vol. 74, No. 8; Feb. 22, 1999; pp. 1177-1179.

(Continued)

*Primary Examiner* — Brian P Mruk
(74) *Attorney, Agent, or Firm* — Jeffrey A. Schmidt

(57) ABSTRACT

A laminate including a glass sheet and a first polymer layer laminated to a first surface of the glass sheet. The glass sheet has a thickness of from 5 to 500 microns, and the first polymer layer provides a coating factor (F) to the glass sheet. The laminate is curved so that a second surface of the glass sheet is disposed in a concave shape; and the coating factor (F) is less than 1. A second polymer layer may be disposed on the second surface of the glass sheet, and its properties may be chosen relative to those of the first (Continued)

polymer layer so as to reduce the maximum principle stress-due to a bending moment-in the glass as compared to a bare glass sheet.

17 Claims, 10 Drawing Sheets

(51) Int. Cl.
  *B32B 17/10* (2006.01)
  *B32B 17/06* (2006.01)
  *H05K 5/02* (2006.01)

(52) U.S. Cl.
  CPC ........ *H05K 5/0217* (2013.01); *B32B 2250/02* (2013.01); *B32B 2250/03* (2013.01); *B32B 2250/40* (2013.01); *B32B 2457/20* (2013.01); *Y10T 428/24628* (2015.01)

(58) Field of Classification Search
  CPC . B32B 2250/40; B32B 2457/20; B65H 20/02; H05K 5/0217; Y10T 428/24628
  See application file for complete search history.

(56) References Cited

U.S. PATENT DOCUMENTS

| | | | |
|---|---|---|---|
| 3,434,915 A | 3/1969 | Garrison | 161/199 |
| 3,560,076 A | 2/1971 | Ceppi | |
| 3,574,030 A | 4/1971 | Callander et al. | 156/244 |
| 3,582,419 A | 6/1971 | Marchand | 156/89 |
| 3,771,855 A | 11/1973 | Burns | 350/160 |
| 3,822,122 A | 7/1974 | Plumat et al. | 65/30 |
| 4,214,886 A | 7/1980 | Shay et al. | 65/121 |
| 4,241,140 A | 12/1980 | Ammons | 428/339 |
| 6,287,674 B1 | 9/2001 | Verlinden et al. | 428/210 |
| 6,548,177 B2 | 4/2003 | Hieda et al. | 428/441 |
| 6,689,626 B2 | 2/2004 | Krijn et al. | 438/22 |
| 6,815,070 B1 | 11/2004 | Bürkle et al. | 428/425.6 |
| 7,201,965 B2 | 4/2007 | Gulati et al. | 428/426 |
| 7,514,866 B2 | 4/2009 | Burroughes et al. | 313/511 |
| 7,833,577 B2 | 11/2010 | Sheridan et al. | |
| 7,910,213 B2 | 3/2011 | Yoshida et al. | |
| 8,241,751 B2 | 8/2012 | Tomamoto et al. | 428/426 |
| 8,683,871 B2 | 4/2014 | Decourcelle et al. | |
| 2006/0132025 A1 | 6/2006 | Gao et al. | |
| 2007/0224427 A1 | 9/2007 | Kunita et al. | 428/420 |
| 2009/0311497 A1 | 12/2009 | Aoki | 428/214 |
| 2010/0143681 A1 | 6/2010 | Yano et al. | 428/216 |
| 2010/0214525 A1 | 8/2010 | Yamaguchi et al. | |
| 2010/0276066 A1 | 11/2010 | Kondo | 156/101 |
| 2011/0114160 A1 | 5/2011 | Murashige et al. | 136/252 |
| 2011/0122559 A1 | 5/2011 | Lee et al. | 361/679.01 |
| 2013/0196163 A1 | 8/2013 | Swanson | 428/426 |

FOREIGN PATENT DOCUMENTS

| | | | |
|---|---|---|---|
| GB | | 1319846 | 6/1973 |
| JP | | 58197047 | 11/1983 |
| JP | | 2001-97733 | 4/2001 |
| JP | | 2001-113631 | 4/2001 |
| JP | | 2011113631 | 4/2001 |
| JP | | 2004-245925 | 9/2004 |
| JP | | 2007-010834 | 1/2007 |
| JP | | 2010-132526 | 6/2010 |
| JP | | 2011-16708 | 1/2011 |
| JP | | 2011-27822 | 2/2011 |
| WO | | 99/58334 | 11/1999 |
| WO | | 2009/057460 | 5/2009 |
| WO | | 2010074748 A1 | 7/2010 |
| WO | WO 2010/074748 | * 7/2010 | ............ B32B 17/10 |
| WO | | 2011/086500 | 7/2011 |

OTHER PUBLICATIONS

Gleskova et al.; Flexible Electronics: Materials and Applications; Chapter 2; Copyright Springer Science+Business Media, LLC 2009; pp. 29-51.

Susumu Nagai; Practical Technical Term Dictionary in Plastics; Japan; Plastics Age Co., Ltd.; Sep. 10, 1989; p. 625.

English Translation of JP2014513535 Office Action Dated Apr. 26, 2016; 4 Pages; Japanese Patent Office.

* cited by examiner

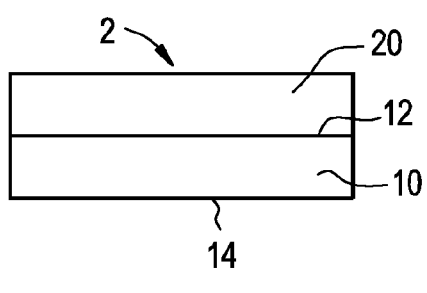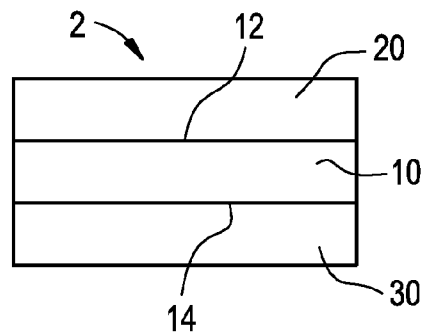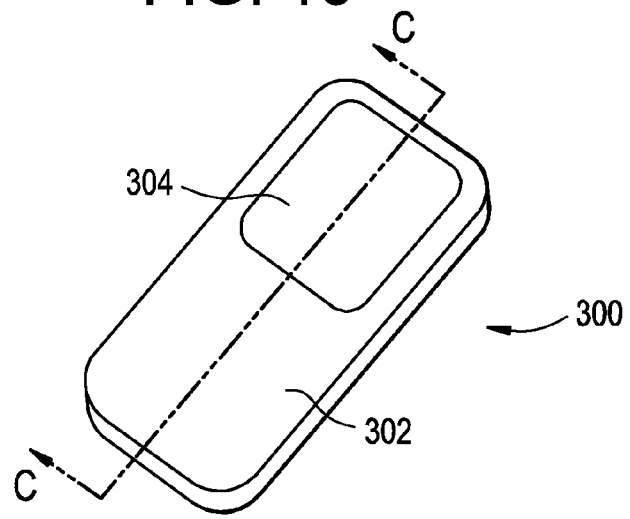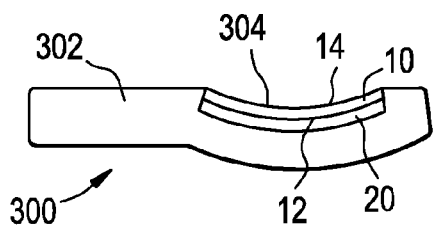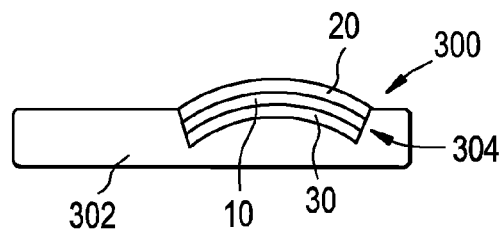

GLASS-PLASTIC LAMINATE DEVICE, PROCESSING LINE AND METHODS THEREFOR

This application claims the benefit of priority of U.S. Provisional Application Ser. No. 61/490,976 filed on May 27, 2011, the content of which is relied upon and incorporated herein by reference in its entirety.

BACKGROUND

Field

The present invention relates to glass-polymer laminates and, more particularly, to flexible glass-polymer laminates wherein the glass thickness is ≤500 microns.

Technical

Today flexible polymer substrates are manufactured using a polymer base material laminated with one or more polymer films. These laminated substrate stacks are commonly used in flexible packaging associated with PV, OLED, LCDs and patterned Thin Film Transistor (TFT) electronics because of their low cost and demonstrated performance.

In order to promote flexible glass structures as an alternate technology selection, the real and perceived limitations of mechanical reliability performance associated with glass, a brittle material, must be overcome and demonstrated. Flexible glass substrates already offer several technical advantages over flexible polymer technology. One technical advantage is the ability of the glass to serve as a moisture or gas barrier, a primary degradation mechanism in outdoor electronics. A second advantage is in its potential to reduce overall package size (thickness) and weight through the reduction or elimination of one or more package substrate layers. Thus, if the real and perceived limitations of mechanical reliability performance associated with glass can be overcome, the use of flexible glass structures can be advanced.

SUMMARY

One technique to improve the mechanical reliability of bare flexible glass is to laminate the flexible glass with one or more thin film polymers. Depending on the mechanical strength requirements and the expected bend stresses and direction of the end application, according to the concepts disclosed herein, a flexible glass-polymer laminate substrate can be designed to meet mechanical requirements. When used properly, the laminated structure will offer improved mechanical reliability performance over a flexible un-laminated (bare glass) structure, and even over a glass-polymer laminate that is used improperly.

Additional features and advantages will be set forth in the detailed description which follows, and in part will be readily apparent to those skilled in the art from the description or recognized by practicing the invention as exemplified in the written description and the appended drawings. It is to be understood that both the foregoing general description and the following detailed description are merely exemplary of the invention, and are intended to provide an overview or framework to understanding the nature and character of the invention as it is claimed.

The accompanying drawings are included to provide a further understanding of principles of the invention, and are incorporated in and constitute a part of this specification. The drawings illustrate one or more embodiment(s), and together with the description serve to explain, by way of example, principles and operation of the invention. It is to be understood that various features of the invention disclosed in this specification and in the drawings can be used in any and all combinations. By way of non-limiting example the various features of the invention may be combined with one another according to the following aspects.

According to a first aspect, there is provided a laminate comprising:

a glass sheet having a thickness of from 5 to 500 microns;

a first polymer laminated to a first surface of the glass sheet, the first polymer providing a coating factor (F) to the glass sheet, wherein the coating factor (F) is defined by the following formula $F=(1-\gamma\beta^2)/(1+\gamma\beta)$, wherein $\gamma=[Ep1(1-vg^2)]/[Eg(1-vp1^2)]$, $\beta=tp1/tg$, $Ep1$=Young's Modulus of the first polymer, $tp1$=thickness of the first polymer, $vp1$=Poisson's Ratio of the first polymer, $Eg$=Young's Modulus of the glass, $tg$=thickness of the glass, and $vg$=Poisson's Ratio of the glass, wherein the laminate is curved so that a second surface of the glass sheet is disposed in a concave shape; and further wherein the coating factor (F) is less than 1.

According to a second aspect, there is provided the laminate of aspect 1, wherein $\beta$ is from 0.002 to 400, and wherein $\gamma$ is from 0.001 to 0.1.

According to a third aspect, there is provided the laminate of aspect 1 or aspect 2, wherein Eg is from 50 to 95 GPa.

According to a fourth aspect, there is provided the laminate of any one of aspects 1 to 3, wherein Ep1 is from 10 to 9500 MPa.

According to a fifth aspect, there is provided the laminate of any one of aspects 1 to 3, wherein Ep1 is from 100 to 7000 MPa.

According to a sixth aspect, there is provided the laminate of any one of aspects 1 to 3, wherein Ep1 is from 500 to 6500 MPa.

According to a seventh aspect, there is provided a laminate comprising:

a glass sheet having a first surface, a second surface, and a thickness tg of from 5 to 500 microns;

a first polymer layer laminated to the first surface of the glass sheet, the first polymer layer having a first Young's Modulus (Ep1), a first thickness (tp1), and a first Poison's ratio (vp1);

a second polymer layer laminated to the second surface of the glass sheet, the second polymer layer having a second Young's Modulus (Ep2), a second thickness (tp2), and a second Poisson's Ratio (vp2);

wherein the glass sheet is curved so that the second surface is disposed in a concave shape; and further wherein the first polymer layer and the second polymer layer are configured so that $$[(Ep1tp1(tg+tp1))/(1-vp1^2)]>[(Ep2tp2(tg+tp2))/(1-vp2^2)].$$

According to an eighth aspect, there is provided the laminate of aspect 7, wherein the second polymer is of a type different from that of the first polymer layer.

According to a ninth aspect, there is provided the laminate of aspect 7, wherein the second polymer is of the same type as that in the first polymer layer, but of a different thickness than that of the first polymer layer.

According to a tenth aspect, there is provided the laminate of any one of aspects 7 to 9, wherein the second polymer layer is a laminate of different polymers, and wherein Ep2, tp2, and vp2, are effective values for the second polymer layer.

According to an eleventh aspect, there is provided the laminate of any one of aspects 1 to 10, wherein the first polymer layer is a laminate of different polymers, and wherein Ep1, tp1, and vp1, are effective values for the first polymer layer.

According to a twelfth aspect, there is provided the laminate of any one of aspects 1 to 11, wherein the glass has a thickness of from 25 to 400 microns.

According to a thirteenth aspect, there is provided the laminate of any one of aspects 1 to 11, wherein the glass has a thickness of from 50 to 300 microns.

According to a fourteenth aspect, there is provided the laminate of any one of aspects 1 to 11, wherein the glass has a thickness of from 50 to 250 microns.

According to a fifteenth aspect, there is provided the laminate of any one of aspects 1 to 11, wherein the glass has a thickness of from 50 to 200 microns.

According to a sixteenth aspect, there is provided the laminate of any one of aspects 1 to 11, wherein the glass has a thickness of from 75 to 200 microns.

According to a seventeenth aspect, there is provided the laminate of any one of aspects 1 to 11, wherein the glass has a thickness of from 75 to 150 microns.

According to an eighteenth aspect, there is provided an electronic device comprising:

a housing; and a glass-polymer laminate portion coupled to the housing, wherein the glass-polymer laminate portion comprises a glass sheet having a first surface, a second surface, and a thickness tg of from 5 to 500 microns, a first polymer layer laminated to the first surface of the glass sheet, wherein the glass-polymer laminate is curved so that the second surface of the glass sheet is disposed in a concave shape.

According to a nineteenth aspect, there is provided the device of aspect 18, wherein the first polymer layer provides a coating factor (F) to the glass sheet, wherein the coating factor (F) is defined by the following formula $$F=(1-\gamma\beta^2)/(1+\gamma\beta), \text{ wherein}$$

$\gamma=[Ep1(1-vg^2)]/[Eg(1-vp1^2)]$, $\beta=tp1/tg$,

Ep1=Young's Modulus of the first polymer, tp1=thickness of the first polymer, vp1=Poisson's Ratio of the first polymer, Eg=Young's Modulus of the glass, tg=thickness of the glass, and vg=Poisson's Ratio of the glass, wherein the laminate is curved so that a second surface of the glass sheet is disposed in a concave shape; and further wherein the coating factor (F) is less than 1.

According to a twentieth aspect, there is provided the device of aspect 18, wherein the first polymer layer has a first Young's Modulus (Ep1), a first thickness (tp1), and a first Poison's ratio (vp1);

the glass-polymer laminate portion further comprises a second polymer layer laminated to the second surface of the glass sheet, the second polymer layer having a second Young's Modulus (Ep2), a second thickness (tp2), and a second Poisson's Ratio (vp2); and further wherein the first polymer layer and the second polymer layer are configured so that $$[(Ep1tp1(tg+tp1))/(1-vp1^2)] > [(Ep2tp2(tg+tp2))/(1-vp2^2)].$$

According to a twenty first aspect, there is provided the device of aspect 20, wherein the second polymer layer is comprised of a polymer different from that comprising the first polymer layer.

According to a twenty second aspect, there is provided the device of aspect 20, wherein the second polymer layer is comprised of a polymer that is the same as that in the first polymer layer, but of a thickness different than that of the first polymer layer.

According to a twenty third aspect, there is provided the device of aspect 20 or 22, wherein the second polymer layer is a laminate of different polymers, and wherein Ep2, tp2, and vp2, are effective values for the second polymer layer.

According to a twenty fourth aspect, there is provided the device of any one of aspects 19 to 23, wherein the first polymer layer is a laminate of different polymers, and wherein Ep1, tp1, and vp1, are effective values for the first polymer layer.

According to a twenty fifth aspect, there is provided the device of any one of aspects 18-24, wherein the housing has an inside and an outside, and further wherein the second surface of the glass sheet is disposed so as to face the outside of the housing.

According to a twenty sixth aspect, there is provided the device of any one of aspects 18-24, wherein the housing is curved in a manner complementary to that of the glass-polymer laminate.

According to a twenty seventh aspect, there is provided a roll-to-roll processing line, for a glass-polymer laminate having a first side and a second side, the glass-polymer laminate being either a structure having a first polymer layer on the first side and glass of thickness tg on the second side, or a structure having a first polymer layer on the first side and a second polymer layer on the second side with glass of thickness tg therebetween, the line comprising:

a first roller having a diameter D1, wherein the second side of the glass-polymer laminate is disposed so as to face toward the first roller;

a second roller having a diameter D2, wherein the first side of the glass-polymer laminate is disposed so as to face toward the second roller; and wherein D1<D2, and further wherein when the glass-polymer laminate has a first polymer layer on the first side and a second polymer layer on the second side:

the first polymer layer has a first Young's Modulus (Ep1), a first thickness (tp1), and a first Poison's ratio (vp1);

the second polymer layer has a second Young's Modulus (Ep2), a second thickness (tp2), and a second Poisson's Ratio (vp2); and the first polymer layer and the second polymer layer are configured so that $$[(Ep1tp1(tg+tp1))/(1-vp1^2)] > [(Ep2tp2(tg+tp2))/(1-vp2^2)].$$

According to a twenty eighth aspect, there is provided the processing line of aspect 27, wherein the second polymer layer is a laminate of different polymers, and wherein Ep2, tp2, and vp2, are effective values for the second polymer layer.

According to a twenty ninth aspect, there is provided the device of aspect 27 or aspect 28, wherein the first polymer layer is a laminate of different polymers, and wherein Ep1, tp1, and vp1, are effective values for the first polymer layer.

According to a thirtieth aspect, there is provided a method of conveying a glass-polymer laminate, the glass-polymer laminate having a first side and a second side, the glass-polymer laminate being either a structure having a first polymer layer on the first side and glass of thickness tg on the second side, or a structure having a first polymer layer on the first side and a second polymer layer on the second side with glass of thickness tg therebetween, the line comprising:

conveying the glass-polymer laminate about a first roller having a diameter D1, wherein the second side of the glass-polymer laminate is disposed so as to face toward the first roller;

conveying the glass-polymer laminate about a second roller having a diameter D2, wherein the first side of the glass-polymer laminate is disposed so as to face toward the second roller; and wherein D1<D2, and further wherein when the glass-polymer laminate has a first polymer layer on the first side and a second polymer layer on the second side:

the first polymer layer has a first Young's Modulus (Ep1), a first thickness (tp1), and a first Poison's ratio (vp1);

the second polymer layer has a second Young's Modulus (Ep2), a second thickness (tp2), and a second Poisson's Ratio (vp2); and the first polymer layer and the second polymer layer are configured so that $$[(Ep1 tp1(tg+tp1))/(1-vp1^2)] > [(Ep2 tp2(tg+tp2))/(1-vp2^2)].$$

According to a thirty first aspect, there is provided the method of aspect 30, wherein the second polymer layer is a laminate of different polymers, and wherein Ep2, tp2, and vp2, are effective values for the second polymer layer.

According to a thirty second aspect, there is provided the method of aspect 30 or 31, wherein the first polymer layer is a laminate of different polymers, and wherein Ep1, tp1, and vp1, are effective values for the first polymer layer.

According to a thirty third aspect, there is provided a method of designing a glass-polymer laminate so as to withstand a given required maximum principle stress as generated by a given impact energy, comprising:

for a given glass thickness ranging from 5 microns to 500 microns, and a given glass Young's modulus from 40 to 100 GPa, selecting a polymer thickness and selecting a polymer Young's modulus so that the maximum principle stress in the glass is less than the required maximum principle stress when subject to the given impact energy.

BRIEF DESCRIPTION OF THE DRAWINGS

FIG. 14 is a close-up view of a bi-layer glass-polymer laminate at position B shown in FIG. 13.

FIG. 15 is a close-up view of a tri-layer glass-polymer laminate at position B shown in FIG. 13.

FIG. 16 is a schematic drawing of an electronic device including a glass-polymer laminate.

FIG. 17 is one embodiment of a cross-sectional view as taken along line C-C of FIG. 16.

FIG. 18 is another embodiment of a cross-sectional view as taken along line C-C of FIG. 16.

DETAILED DESCRIPTION

Figure 1:
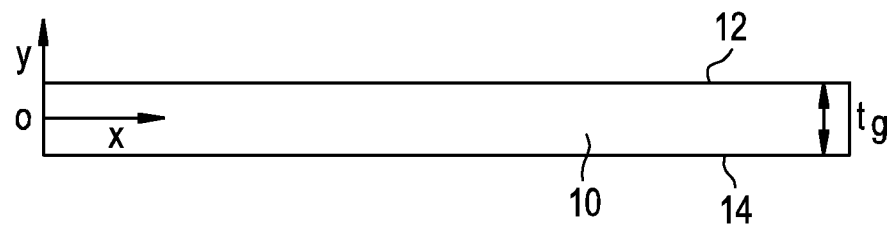
FIG. 1 is a schematic drawing of a piece of glass 10 having a neutral bending axis.

In the following detailed description, for purposes of explanation and not limitation, example embodiments disclosing specific details are set forth to provide a thorough understanding of various principles of the present invention. However, it will be apparent to one having ordinary skill in the art, having had the benefit of the present disclosure, that the present invention may be practiced in other embodiments that depart from the specific details disclosed herein. Moreover, descriptions of well-known devices, methods and materials may be omitted so as not to obscure the description of various principles of the present invention. Finally, wherever applicable, like reference numerals refer to like elements.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

Directional terms as used herein—for example up, down, right, left, front, back, top, bottom—are made only with reference to the figures as drawn and are not intended to imply absolute orientation.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the singular forms "a," "an" and "the" include plural referents unless the context clearly dictates otherwise. Thus, for example, reference to a "component" includes aspects having two or more such components, unless the context clearly indicates otherwise.

Although glass is an inherently strong material, its strength (reliability) is a function of its surface defect or flaw size density distribution and the cumulative exposure of stress to the material over time. During the entire product life cycle, a flexible glass polymer laminate will be subjected to various kinds of static and dynamic mechanical stresses. Therefore a large inherent maximum material strength of the material is designed into a product and should be preserved over time. This starts with the manufacturing process itself and continues throughout the useful product life. The preservation of this mechanical strength will be achieved through the appropriate reliability derating of the applied stress to its maximum strength.

A methodology has been developed to design and predict the mechanical reliability performance (strength) of a flexible glass polymer laminate structure as a result of exposure to common types of stress. These include bending around a diameter of radius r and the bending associated with an impact event. The methodology is based on an understanding of glass failure modes and the effects of stress on surface defects. It can be directly applied to the design of the end device to ensure that the mechanical requirements are met and to ensure the inherent mechanical reliability attributes are preserved over the service life. Further, it can be used to ensure that current or "to be designed" manufacturing processes, equipment and packaging (i.e. spools) are capable of protecting and preserving the inherent strength attributes of the structure during the production cycle.

Herein, a glass-polymer laminate substrate with a single polymer layer laminated to one surface is considered a bi-layer flexible substrate and a glass polymer laminate with a polymer layer on each surface is considered a tri-layer flexible substrate. A tri-layer substrate can be constructed so that the polymer layers on each side of the glass are different in terms of types of polymers in the layer, properties of the polymers, and thickness.

The present disclosure also includes design of a glass-polymer flexible laminate structure, either as a fundamental bi-layer, tri-layer or combinational structure, to enable the mechanical reliability attributes of the structure to meet the mechanical requirements of manufacturing operations (roll to roll processes) and end product devices. When mechanical stresses and bend directions are defined beforehand, a flexible glass substrate thickness can be selected in combination with one or more polymer (polymer) materials. Utilizing the material properties of the laminate layers (e.g. Young's Modulus, Poisson's Ratio), layer thicknesses and glass surface laminate location(s), a tensile strength profile can be modeled to demonstrate compliance to the manufacturing and end product mechanical reliability requirements.

Mechanical reliability of glass is impacted by the control of its surface defect population and the proper stress management of the glass throughout the entire life cycle of the product in which it is disposed. Mechanical glass reliability can be affected by the following: (1) Uni-axial bending of the glass substrate such that the surface defect population is placed under tensile stress. This stress is often associated with the bending of the substrate around a radius (for example, a conveyance roller) in sheet or roll to roll manufacturing operations; and (2) Impact loading of the glass such that the surface defect population is placed under tensile stress in two axial planes. This type of stress is produced when the glass experiences a dynamic impact deflecting its surface.

Uni-Axial Bending of Uncoated Glass

When a piece of glass (either a sheet or ribbon of glass) is bent into a curve of radius R (such as when the glass is held in a device or bends around a roller during processing), there is created a stress in the glass. The configuration of an uncoated piece of glass is shown in FIG. 1. When the piece of glass is subject to a bending moment applied about the z axis in this figure, so that the glass achieves a bending radius R, the stress at a location (y) relative to the x-axis (neutral axis) can be calculated by formula [1] below:

$$\sigma = \frac{Eg}{1 - vg^2} \kappa \quad [1]$$

$$y = \frac{2Egy}{D(1 - vg^2)}$$

wherein:
σ is the stress;
Eg is the Young's modulus of the glass;
vg is the Poisson's ratio of the glass;
K is the bending curvature and is equal to 2/D;
y is the position in the y-axis direction at which the stress σ is calculated;
D is twice the bending radius R of the glass;
tg is the thickness of the glass.

The maximum tensile stress occurs on either side of the glass, and will be either surface 12 or surface 14 depending on the bending direction. That is, if the glass 10 is bent so that surface 12 is convex, the maximum tensile stress will be on surface 12, whereas if the glass 10 is bent so that surface 14 is convex, the maximum tensile stress will be on surface 14. In either case, substituting ½ tg for y in formula [1], the absolute value of the maximum stress σmax is defined by formula [2] below:

$$|\sigma\max| = \frac{(Eg)(tg)}{D(1 - vg^2)} \quad [2]$$

Uni-Axial Bending of a Bi-Layer Glass-Polymer Laminate

Figure 2:
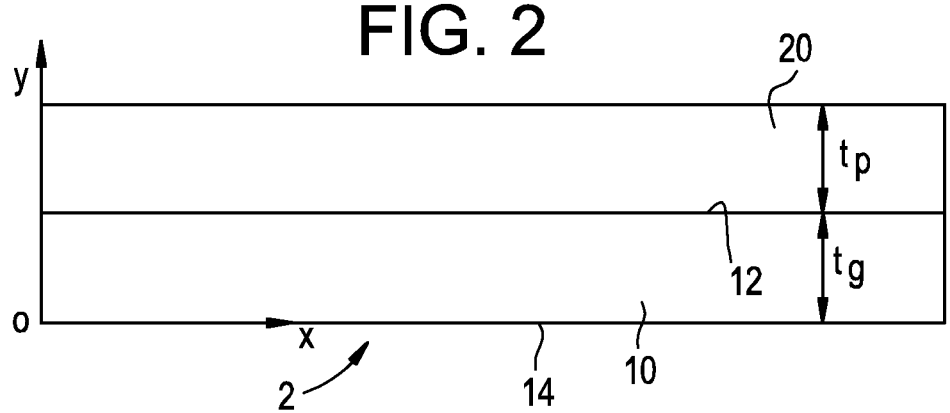
FIG. 2 is a schematic drawing of a bi-layer glass-polymer laminate.

As shown in FIG. 2, when the glass 10 has a polymer layer 20 laminated on one surface thereof, surface 12 as shown in FIG. 2, the neutral axis y0 is defined by the following formula [3]

$$y0 = \frac{tg(1 + 2\gamma\beta + \gamma\beta^2)}{2(1 + \gamma\beta)} \quad [3]$$

wherein:

$$\gamma = \frac{Ep(1 - vg^2)}{Eg(1 - Vp^2)}$$

$\beta = tp/tg$;
tp is the thickness of the polymer;
Ep is the Young's modulus of the polymer;
vp is the Poison's ratio of the polymer.

The stress σ in the glass at a position y relative to y0, when the laminate is bent with a radius of curvature R is then defined by the following formula [4]

$$\sigma = \frac{Eg\kappa}{1 - vg^2}(y - y_0) = \frac{Eg\kappa}{1 - vg^2}\left(y - \frac{tg(1 + 2\gamma\beta + \gamma\beta^2)}{2(1 + \gamma\beta)}\right) \quad [4]$$

Figure 3:
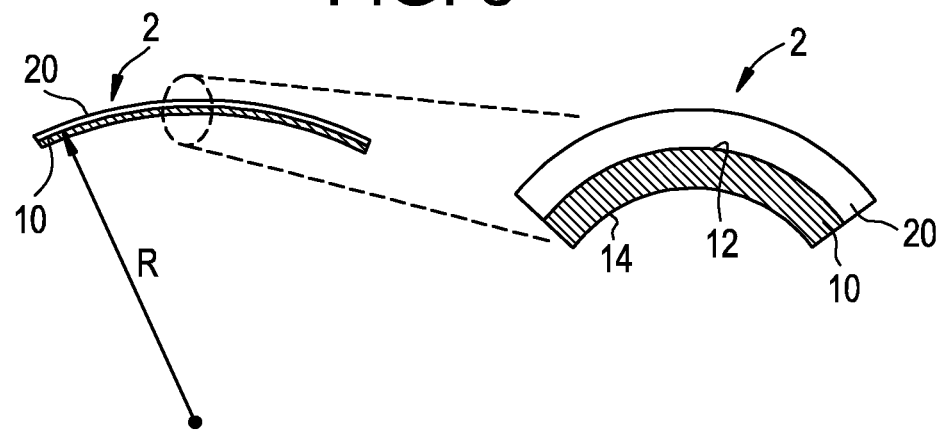
FIG. 3 is a schematic drawing of a bi-layer glass-polymer laminate when subject to a bending moment.

As shown in FIG. 3, when the laminate is bent with a radius of curvature R and so that the surface 12 (having the polymer layer 20 thereon) is convex (the surface 14—without the polymer layer 20—is concave), the maximum tensile stress σmax in the glass will occur at surface 12 and will be defined by the following formula [5]

$$\sigma\max = \frac{Eg\kappa tg}{2(1 - vg^2)} \times \frac{1 - \gamma\beta^2}{1 + \gamma\beta} = \frac{Egtg}{D(1 - vg^2)} \times \frac{1 - \gamma\beta^2}{1 + \gamma\beta} \quad [5]$$

Comparing formulas [2] and [5], it can be seen that as compared with the case for the bare glass, the polymer layer introduces a multiplier to the maximum stress σmax for the glass and, more specifically, that multiplier (hereinafter called a coating factor F) is defined by formula [6].

$$F = \frac{1 - \gamma\beta^2}{1 + \gamma\beta} \quad [6]$$

If the coating factor F is 1, then formula [5] reduces to formula [2], whereby it is seen that the polymer has no effect on the maximum bending stress in the glass at surface 12 when the laminate takes on the configuration of FIG. 3. That is, the bending stress at surface 12 is unaffected by the polymer layer 20. However, if the coating factor F is less than one, then the maximum stress in the glass as calculated by formula [5] would be reduced as compared with that calculated by formula [2] or, in other words, the tensile stress at surface 12 would be reduced by the presence of the polymer layer 20. The coating factor F can be made less than one by suitably choosing β and γ.

Figure 4:
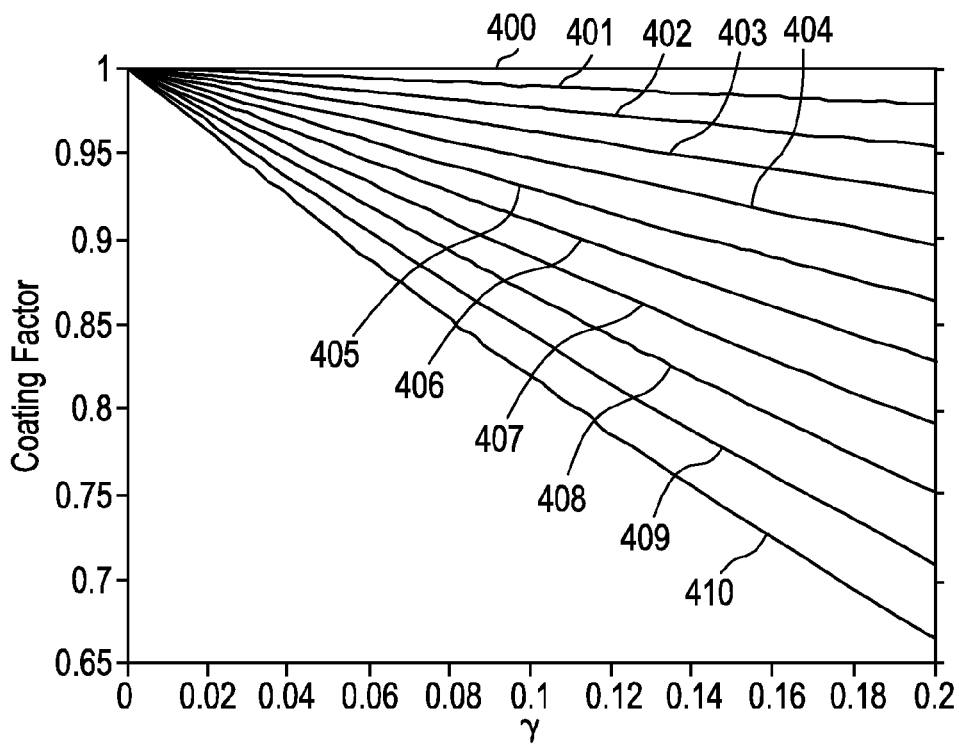
FIG. 4 is a graph of a family of bending stress curves for constant $\beta$ as a function of coating factor and $\gamma$, for $\beta$ from 0 to 1, for the bi-layer glass-polymer laminate oriented as in FIG. 3.
Figure 5:
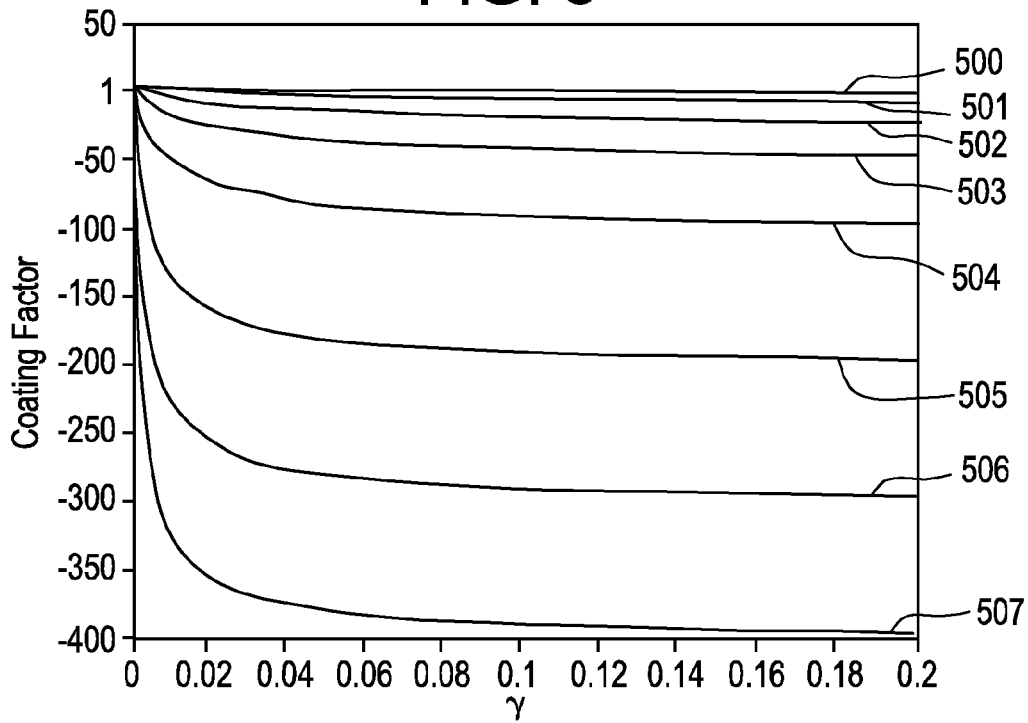
FIG. 5 is a graph of a family of bending stress curves for constant $\beta$ as a function of coating factor and $\gamma$, for $\beta$ from 1 to 400, for the bi-layer glass-polymer laminate oriented as in FIG. 3.
Figure 6:
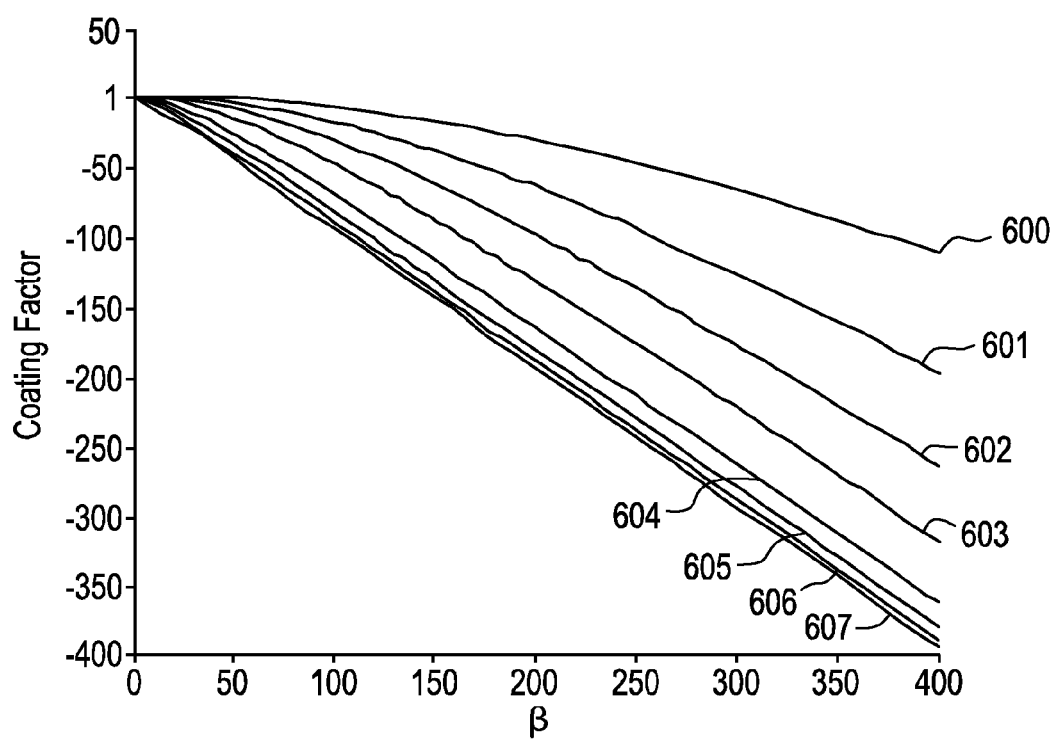
FIG. 6 is a family of bending stress curves for constant $\gamma$ as a function of coating factor and $\beta$, for $\gamma$ from 0.001 to 0.2, for the bi-layer glass-polymer laminate oriented as in FIG. 3.

FIGS. 4-6 show a modeling result of the effect on the coating factor F for various changes in β and γ. For these figures, the glass thickness was assumed to range from 5 microns to 500 microns (for example, 5, 10, 15, 20, 25, 30, 35, 40, 45, 50, 55, 60, 65, 70, 75, 80, 85, 90, 95, 100, 110, 120, 130, 140, 150, 160, 170, 180, 190, 200, 210, 220, 230, 240, 250, 260, 270, 280, 290, 300, 310, 320, 330, 340, 350, 360, 370, 380, 390, 400, 410, 420, 430, 440, 450, 460, 470, 480, 490, 500 microns), the polymer thickness was assumed to range from 1 micron to 2000 microns, the Young's modulus of the glass was assumed to range from 50 to 95 GPa (for example, 50, 55, 60, 65, 70, 75, 80, 85, 90, 95 GPa), the Young's modulus of the polymer was assumed to range from 10 to 9500 MPa (for example, 10, 20, 30, 40, 50, 60, 70, 80, 90, 100, 110, 120, 130, 140, 150, 175, 200, 225, 250, 275, 300, 350, 400, 450, 500, 550, 600, 650, 700, 750, 800, 850, 900, 950, 1000, 1100, 1200, 1300, 1400, 1500, 1600, 1700, 1800, 1900, 2000, 2100, 2200, 2300, 2400, 2500, 2600, 2700, 2800, 2900, 3000, 3100, 3200, 3300, 3400, 3500, 3600, 3700, 3800, 3900, 4000, 4100, 4200, 4300, 4400, 4500, 4600, 4700, 4800, 4900, 5000, 5100, 5200, 5300, 5400, 5500, 5600, 5700, 5800, 5900, 6000, 6100, 6200, 6300, 6400, 6500, 6600, 6700, 6800, 6900, 7000, 7100, 7200, 7300, 7400, 7500, 7600, 7700, 7800, 7900, 8000, 8100, 8200, 8300, 8400, 8500, 8600, 8700, 8800, 8900, 9000, 9100, 9200, 9300, 9400, 9500 MPa). At these values of Young's modulus, the Poisson's Ratios have a small impact on the coating factor F, and can be ignored for sake of simplicity. For example, a suitable glass composition, Corning Eagle XG™, available from Corning Incorporated, Corning N.Y., has a Young's modulus of about 74 GPa and a Poisson's Ratio of about 0.23. However, in other cases, it may be useful to include the Poisson's Ratio for a more complete calculation of coating factor F.

In FIG. 4, the family of curves represent constant β values from 0 to 1 and, more specifically: curve 400 shows β=0; curve 401 shows β=0.1; curve 402 shows β=0.2; curve 403 shows β=0.3; curve 404 shows β=0.4; curve 405 shows β=0.5; curve 406 shows β=0.6; curve 407 shows β=0.7; curve 408 shows β=0.8; curve 409 shows β=0.9; curve 410 shows β=1.0. On the other hand, γ ranges from 0 to 0.2 (for example, 0.02, 0.04, 0.06, 0.08, 0.1, 0.12, 0.14, 0.16, 0.18, and 0.2). As can be seen from FIG. 4, for a constant non-zero β (any one of curves 401-410), the coating factor F decreases for increasing γ (and in an approximate sense, when ignoring Poisson's Ratio, as the Young's modulus of the polymer increases relative to that of the glass). Similarly, for a given γ, the coating factor F decreases for an increasing β (i.e., as the polymer thickness increases relative to that of the glass). In any case, for β and γ each greater than 0, the coating factor F is less than 1, meaning that the polymer layer 20 is always beneficial in reducing the maximum tensile stress in the glass 10 at the surface 12 as compared with the bare glass case of FIG. 1. Accordingly, when a glass-polymer laminate is disposed in the configuration of FIG. 3, i.e., so that surface 12 having the polymer layer 20 therein is disposed in a convex orientation, and so that the surface 14 without the polymer layer 20 thereon is in a concave orientation, the glass of the glass-polymer laminate will be more robust as compared with the bare glass case of FIG. 1. Accordingly, when disposing the glass-polymer laminate in a device, it is beneficial to mount it in the configuration shown in FIG. 3.

FIGS. 5 and 6 show a similar result as discussed above in connection with FIG. 4. In particular, in FIG. 5, the coating factor F is shown as a function of β and γ, wherein the family of curves represent constant β values from 1 to 400 and, more particularly: curve 500 shows β=1; curve 501 shows β=10; curve 502 shows β=25; curve 503 shows β=50; curve 504 shows β=100; curve 505 shows β=200; curve 506 shows β=300; and curve 507 shows β=400. From FIG. 5, it can be seen that with a suitable selection of relative thicknesses for the polymer layer 20 and the glass 10 (suitable β), the coating factor F can be made negative. That is, the glass 10 can be put into compression, wherein it is very durable and it is difficult for any defects to propagate therethrough. FIG. 6 shows a similar range for β, but wherein the family of curves represents constant γ and, in particular: curve 600 shows γ=0.001; curve 601 shows γ=0.0025; curve 602 shows γ=0.005; curve 603 shows γ=0.01; curve 604 shows γ=0.025; curve 605 shows γ=0.05; curve 606 shows γ=0.1; and curve 607 shows γ=0.2.

However, a polymer layer 20 does not always beneficially reduce the maximum stress in the glass 10. For example, with reference to FIGS. 7-10, when the glass-polymer laminate is disposed in the configuration shown in FIG. 7, wherein the surface 14 (i.e., that without the polymer layer 20 thereon) is put into a convex configuration (and so that the surface 12 having the polymer layer 20 thereon is disposed in a concave configuration), the maximum tensile stress in the glass σmax is increased, whereby the glass of the glass-polymer laminate is less robust than the bare glass of FIG. 1. More particularly, the maximum tensile stress for the configuration of FIG. 7 occurs on surface 14, and is given by the following formula [7]

$$\sigma\max = \frac{Eg t_g}{D(1-v_g^2)} \times \frac{1+2\gamma\beta+\gamma\beta^2}{1+\gamma\beta} \quad [7]$$

Comparing formulas [7] and [2], it can be seen that as compared with the case for the bare glass, the polymer layer introduces a coating factor F defined by formula [8]

$$F = \frac{1+2\gamma\beta+\gamma\beta^2}{1+\gamma\beta} \quad [8]$$

Figure 7:
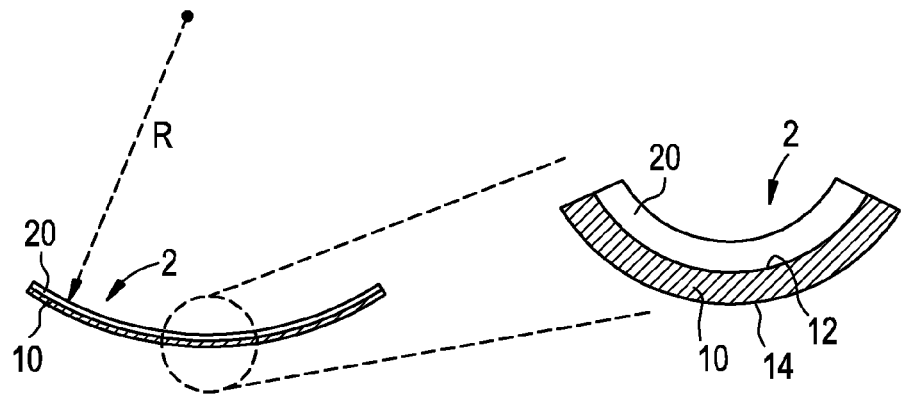
FIG. 7 is a schematic drawing of a bi-layer glass-polymer laminate when subject to a bending moment in a direction opposite to that in FIG. 3.

In this case, however, i.e., the case of FIG. 7 wherein the surface 12 having the polymer layer 20 thereon is configured in a concave manner, the coating factor F may at best be equal to one. Accordingly, at best, the polymer layer 20 in this configuration does no harm, but cannot reduce the maximum tensile stress in the glass as compared with the case of the bare glass. Stated another way, orienting the glass-polymer laminate in this configuration does not increase the robustness of the glass and, in fact, is likely to reduce it.

Figure 8:
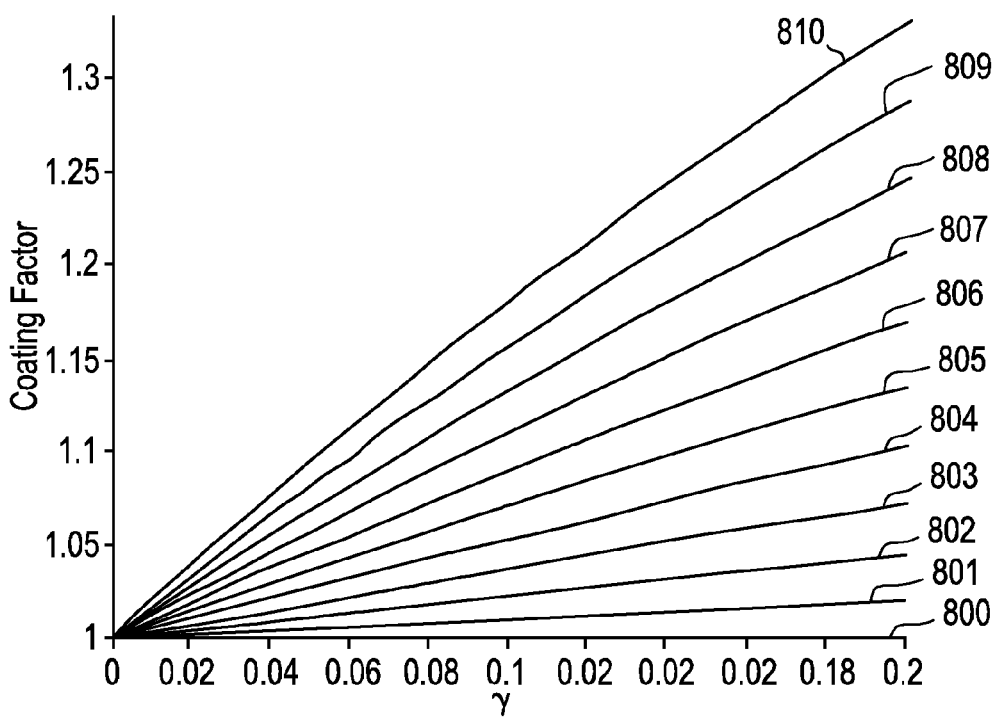
FIG. 8 is a graph of a family of bending stress curves for constant $\beta$ as a function of coating factor and $\gamma$, for $\beta$ from 0 to 1, for the bi-layer glass-polymer laminate oriented as in FIG. 7.
Figure 9:
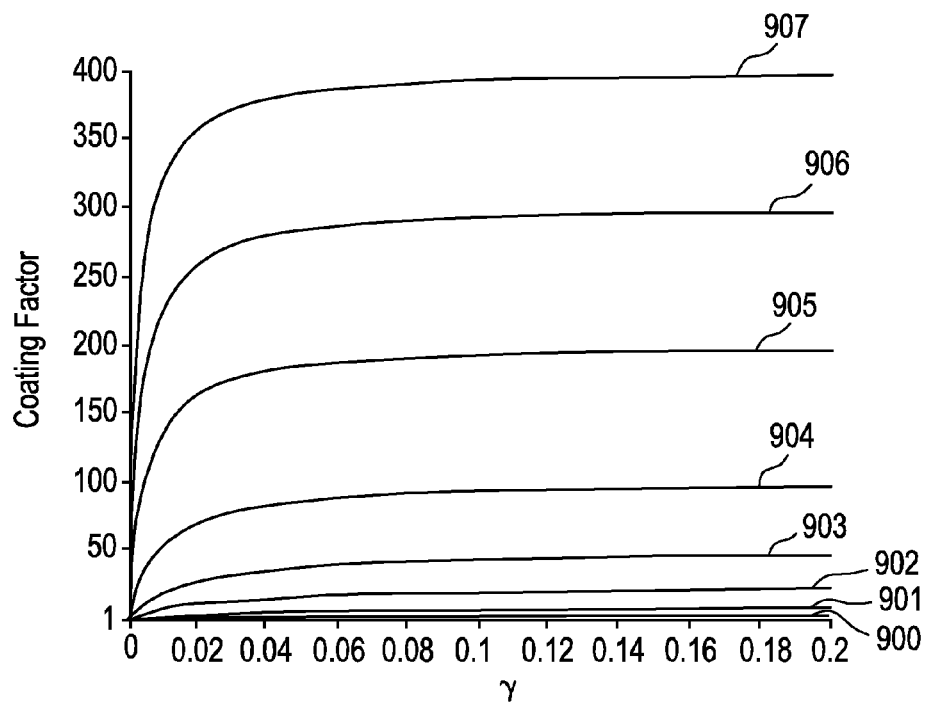
FIG. 9 is a graph of a family of bending stress curves for constant $\beta$ as a function of coating factor and $\gamma$, for $\beta$ from 1 to 400, for the bi-layer glass-polymer laminate oriented as in FIG. 7.
Figure 10:
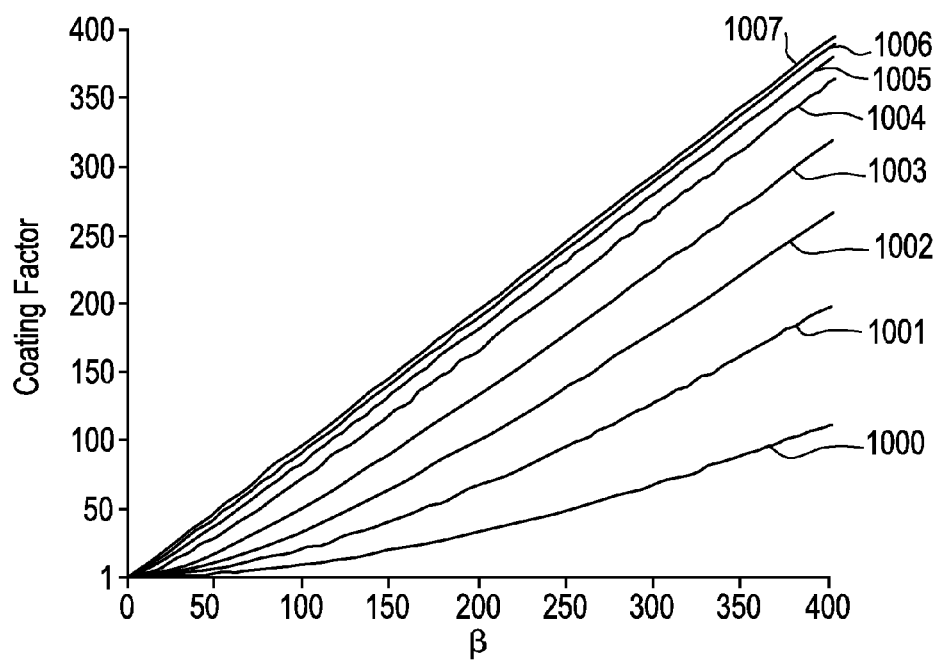
FIG. 10 is a family of bending stress curves for constant $\gamma$ as a function of coating factor and $\beta$, for $\gamma$ from 0.001 to 0.2, for the bi-layer glass-polymer laminate oriented as in FIG. 7.

FIGS. 8-10 show a modeling result of the effect on the coating factor F for various changes in β and γ. For these figures, the glass thickness was assumed to range from 5 microns to 500 microns (for example, 5, 10, 15, 20, 25, 30, 35, 40, 45, 50, 55, 60, 65, 70, 75, 80, 85, 90, 95, 100, 110, 120, 130, 140, 150, 160, 170, 180, 190, 200, 210, 220, 230, 240, 250, 260, 270, 280, 290, 300, 310, 320, 330, 340, 350, 360, 370, 380, 390, 400, 410, 420, 430, 440, 450, 460, 470, 480, 490, 500 microns), the polymer thickness was assumed to range from 1 micron to 2000 microns, the Young's modulus of the glass was assumed to range from 50 to 95 GPa (for example, 50, 55, 60, 65, 70, 75, 80, 85, 90, 95 GPa), the Young's modulus of the polymer was assumed to range from 10 to 9500 MPa (for example, 10, 20, 30, 40, 50, 60, 70, 80, 90, 100, 110, 120, 130, 140, 150, 175, 200, 225, 250, 275, 300, 350, 400, 450, 500, 550, 600, 650, 700, 750, 800, 850, 900, 950, 1000, 1100, 1200, 1300, 1400, 1500, 1600, 1700, 1800, 1900, 2000, 2100, 2200, 2300, 2400, 2500, 2600, 2700, 2800, 2900, 3000, 3100, 3200, 3300, 3400, 3500, 3600, 3700, 3800, 3900, 4000, 4100, 4200, 4300, 4400, 4500, 4600, 4700, 4800, 4900, 5000, 5100, 5200, 5300, 5400, 5500, 5600, 5700, 5800, 5900, 6000, 6100, 6200, 6300, 6400, 6500, 6600, 6700, 6800, 6900, 7000, 7100, 7200, 7300, 7400, 7500, 7600, 7700, 7800, 7900, 8000, 8100, 8200, 8300, 8400, 8500, 8600, 8700, 8800, 8900, 9000, 9100, 9200, 9300, 9400, 9500 MPa). At these values of Young's modulus, the Poisson's Ratios have a small impact on the coating factor F, and can be ignored for sake of simplicity. For example, a suitable glass composition, Corning Eagle XG™, has a Young's modulus of about 74 GPa and a Poisson's Ratio of about 0.23. However, in other cases, it may be useful to include the Poisson's Ratio for a more complete calculation of coating factor F.

In FIG. 8, the family of curves represent constant β values from 0 to 1 and, more specifically: curve 800 shows β=0; curve 801 shows β=0.1; curve 802 shows β=0.2; curve 803 shows β=0.3; curve 804 shows β=0.4; curve 805 shows β=0.5; curve 806 shows β=0.6; curve 807 shows β=0.7; curve 808 shows β=0.8; curve 809 shows β=0.9; curve 810 shows β=1.0. On the other hand, γ ranges from 0 to 0.2 (for example, 0.02, 0.04, 0.06, 0.08, 0.1, 0.12, 0.14, 0.16, 0.18, and 0.2). As can be seen from FIG. 8, for a constant non-zero β (any one of curves 801-810), the coating factor F increases for increasing γ (and in an approximate sense, when ignoring Poisson's Ratio, as the Young's modulus of the polymer increases relative to that of the glass). Similarly, for a given γ, the coating factor F increases for an increasing β (i.e., as the polymer thickness increases relative to that of the glass). In any case, for β and γ each greater than 0, the coating factor F is greater than 1, meaning that the polymer layer 20 increases the maximum tensile stress in the glass 10 at the surface 14 as compared with the bare glass case of FIG. 1. Accordingly, when a glass-polymer laminate is disposed in the configuration of FIG. 7, i.e., so that surface 12 having the polymer layer 20 therein is disposed in a concave orientation, and so that the surface 14 without the polymer layer 20 thereon is in a convex orientation, the glass of the glass-polymer laminate will be less robust as compared with the bare glass case of FIG. 1.

FIGS. 9 and 10 show a similar result as discussed above in connection with FIG. 8. In particular, in FIG. 9, the coating factor F is shown as a function of β and γ, wherein the family of curves represent constant β values from 1 to 400 and, more particularly: curve 900 shows β=1; curve 901 shows β=10; curve 902 shows β=25; curve 903 shows β=50; curve 904 shows β=100; curve 905 shows β=200; curve 906 shows β=300; and curve 907 shows β=400. FIG. 10 shows a similar range for β, but wherein the family of curves represents constant γ and, in particular: curve 1000 shows γ=0.001; curve 1001 shows γ=0.0025; curve 1002 shows γ=0.005; curve 1003 shows γ=0.01; curve 1004 shows γ=0.025; curve 1005 shows γ=0.05; curve 1006 shows γ=0.1; and curve 1007 shows γ=0.2.

Uni-Axial Bending of a Tri-Layer Glass-Polymer Laminate

Figure 11:
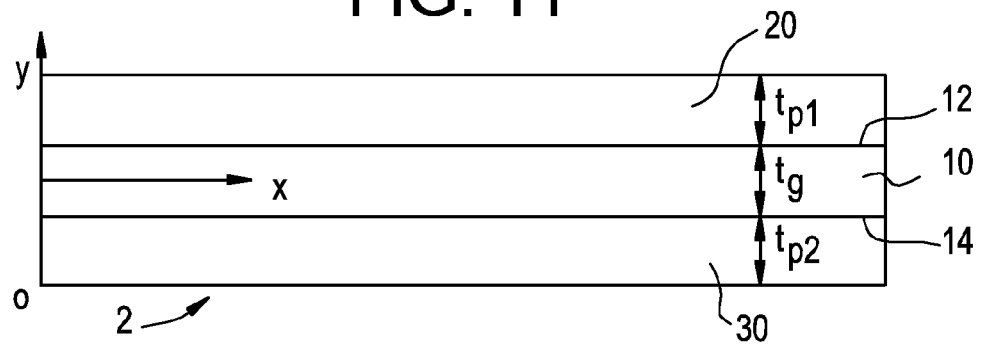
FIG. 11 is a schematic drawing of a tri-layer glass-polymer laminate.

FIG. 11 shows a tri-layer flexible glass-polymer laminate, wherein like reference numerals and variables represent like terms as discussed above in connection with FIGS. 1-10. In this configuration, the glass-polymer laminate includes glass 10 having surfaces 12 and 14, a first polymer layer 20 and a second polymer layer 30.

The neutral axis y0 for this case is given by the following formula [9]

$$y0 = \frac{tg(\gamma_1\beta_1(1+\beta_1) - \gamma_2\beta_2(1+\beta_2))}{2(1+\gamma_1\beta_1+\gamma_2\beta_2)} \quad [9]$$

wherein:

$$\gamma1 = \frac{(Ep1)(1-vg^2)}{Eg(1-vp1^2)},$$

$$\gamma2 = \frac{(Ep2)(1-vg^2)}{Eg(1-vp2^2)},$$

β1=tp1/tg;
β2=tp2/tg;
tp1=thickness of the first polymer layer 20;
tp2=thickness of the second polymer layer 30;
Ep1=Young's modulus of the first polymer layer 20;
EP2=Young's modulus of the second polymer layer 30;
vp1=Poisson's Ratio of the first polymer layer 20; and
vp2=Poisson's Ratio of the second polymer layer 30.

Figure 12:
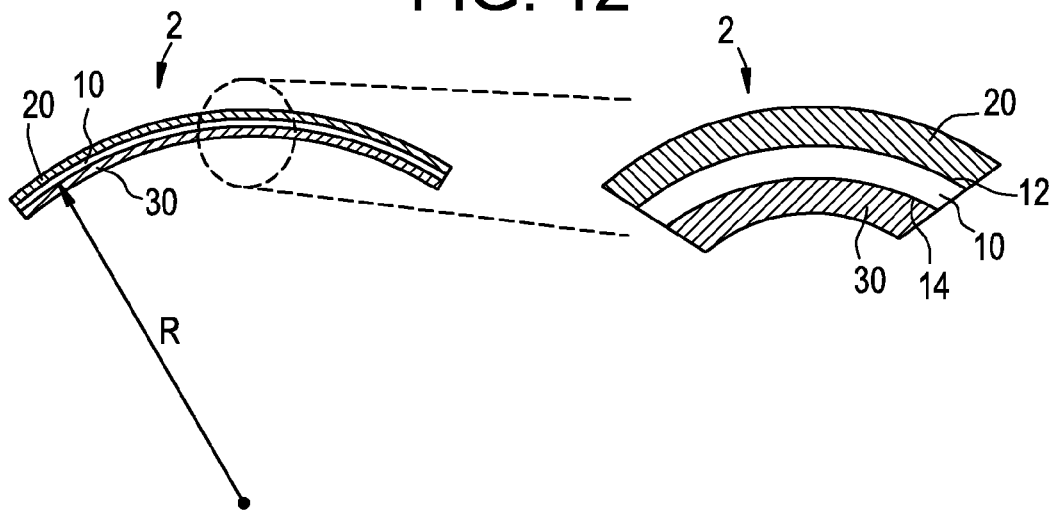
FIG. 12 is a schematic drawing of a tri-layer glass-polymer laminate when subject to a bending moment.

The bending stress σ in the glass for this case is given by the following formula [10]

$$\sigma = \frac{Eg}{1-vg^2}\kappa(y-y_0) \quad [10]$$

$$= \frac{Eg}{1-vg^2}\kappa\left(y - \frac{tg(\gamma_1\beta_1(1+\beta_1) - \gamma_2\beta_2(1+\beta_2))}{2(1+\gamma_1\beta_1+\gamma_2\beta_2)}\right)$$

wherein:
/K/=2/D; and
D is twice the bending radius R of the glass-polymer laminate. From the above formulas [9] and [10] it can be seen that
when $$\gamma_1\beta_1(1+\beta_1) > \gamma_2\beta_2(1+\beta_2), \quad [11]$$

or when [12]

$$\frac{(Ep1)(tp1)(tg+tp1)}{1-vp1^2} > \frac{(Ep2)(tp2)(tg+tp2)}{1-vp2^2}, \quad [12]$$

then y0>0 and the maximum tensile stress in the glass for the configuration of FIG. 12 will be lower than that for the case of bare glass as in FIG. 1. In practicality, the above shows that the properties of the polymer layers 20 and 30 can be suitably chosen relative to one another so that the maximum tensile stress in the glass would be reduced when the glass-polymer laminate is disposed in a curved configuration, thereby making the glass of the glass-polymer laminate more robust. On the other hand, however, if the properties of the second polymer layer 30 are chosen to be relative to those of the first polymer layer 20 so as to reverse the inequalities in formulas [11] and/or [12] above, when the glass-polymer laminate is in the configuration of FIG. 12, then the maximum tensile stress in the glass will be greater than that for the case of bare glass. That is, for the asymmetric tri-layer glass-polymer laminate, the maximum tensile stress will increase or decrease depending on the relative magnitude of [Ep tp (tg+tp)]/(1−vp²) of the two coating layers, and on the bending direction. The polymer layers 20, 30 may be different polymers, or may be the same polymer with a different thickness.

Also, from the above formulas [9] and [10], it can be seen that when the first and second polymer layers 20 and 30 are of the same type having the same Young's modulus, same thickness, and same Poisson's ratio, (i.e., the glass-polymer laminate is symmetrical) then the maximum tensile stress formula becomes the same as the case for bare glass. However, the bending moment to achieve the same bending curvature increases for the case of the symmetrical glass-polymer laminate increases due to the increased flexural rigidity as compared with the bare glass case.

Application

The bending radius R may be imparted by a roller as the glass-polymer laminate is conveyed through a forming or processing line which may be a batch or continuous processing line—although the line may be a forming or processing line for example, and may be a batch or continuous processing line, for the sake of ease in explanation only, the conveyance will be described in connection with a continuous processing line. When conveyed in a continuous processing line, the glass-polymer laminate may be in the form of a continuous ribbon. In such processing lines, the ribbon is typically wound around a series of rollers to accumulate sections of the ribbon between various processing stations, for example. The rollers may move to maintain tension in the ribbon as length of the ribbon is accumulated. The rollers may be manipulated to maintain tension in the ribbon by a dead weight system, or by actively moving one or more of the rollers with drivers (either individually or in a master/slave arrangement). Because there may be many rollers in succession, it is desirable to have the rollers of as small a radius as possible to minimize the space used. The concepts disclosed herein may be applied to such ribbon conveyance so as to minimize the space taken by the rollers.

Figure 13:
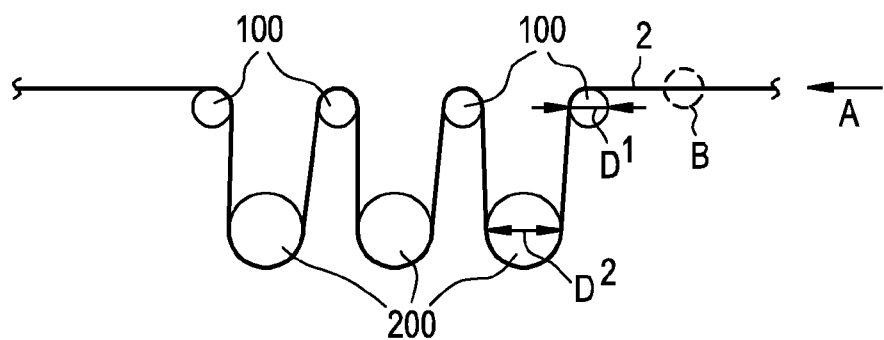
FIG. 13 is a schematic drawing of a glass-polymer laminate as disposed around rollers in a portion of a processing line.

One embodiment of roller section in a continuous processing line is shown in FIG. 13. In this figure, the glass-polymer laminate 2 is conveyed in the direction of arrow A through a series of first rollers 100 and second rollers 200. At location B, the glass-polymer laminate orientation is shown in FIG. 14 for the bi-layer example wherein the glass 10 is disposed so as to face rollers 100 and the polymer layer 20 is disposed so as to face rollers 200. As the glass-polymer laminate 2 is conveyed around first rollers 100, it is disposed in an orientation similar to that shown in FIG. 3, wherein the polymer layer 20 provides a stress-reducing function. On the other hand, when the glass-polymer laminate 2 is conveyed about rollers 200, it is disposed in an orientation similar to that shown in FIG. 7, wherein the polymer layer increases the stress in the glass 10. Accordingly, comparing each of these situations, for a glass-polymer laminate having a given allowable stress for the glass 10, and because the maximum tensile stress in the glass as induced by a particular roller is inversely dependent on the roller diameter D (see formulas [5] and [7]), the diameter D1 of the rollers 100 can be made smaller than that D2 of rollers 200. Such a design of the processing line allows a reduction in space over a similar processing line having one size roller designed to safely convey the glass-polymer laminate for the worst case scenario.

A similar advantage in reduced roller size can be achieved with a tri-layer glass-polymer laminate. FIG. 15 shows the glass-polymer laminate orientation at location B of FIG. 13 for the tri-layer example, wherein second polymer layer 30 is disposed so as to face the first rollers 100 and the first polymer layer 20 is disposed so as to face the second rollers

200. When the properties of the first and second polymer layers 20, 30 are chosen according to the relationships in formulas [11] and/or [12], again—similar to the explanation above in connection with the bi-layer case—rollers 100 may have a smaller diameter than rollers 200.

Although only four rollers 100 and three rollers 200 are shown, any suitable number of each roller type may be used. Also, although rollers 100 are shown as being disposed above rollers 200, another configuration wherein rollers 200 are disposed above rollers 100 may be used as well.

In another embodiment, the bending radius R may be imparted to the glass-polymer laminate as it is held in a device, wherein the bending may be for aesthetic or functional purposes—for example, to assist in producing 3-D effects in a display. A schematic representation of a device is shown in FIGS. 16-18. The device 300 includes a housing 302 and a glass-polymer laminate portion 304. The portion 304 may be a portion through which light is emitted, or may be an encapsulant/barrier portion in a stack of materials, for example.

In order to improve the robustness of the device 300, the glass polymer laminate portion 304 may be disposed in the configuration as shown in FIG. 17, wherein the polymer layer 20 is disposed toward the inside of the housing, and the surface 14 of the glass 10 is disposed in a concave manner and so as to face outwardly of the housing. Alternatively, the glass-polymer laminate portion 304 may be disposed in the configuration as shown in FIG. 18, wherein the polymer layer 20 is disposed toward the outside of the housing, and the surface 14 of the glass 10 is disposed in a concave manner and so as to face toward the inside of the housing 302.

In each of FIGS. 17 and 18, if the glass-polymer laminate portion 304 is a tri-layer structure, it would include second polymer layer 30 oriented as shown and having properties that satisfy formula [11] and/or [12] relative to the properties of the first polymer layer 20. The housing 302 may have a configuration in which it is curved in a manner complementary to that of the glass-polymer laminate portion 304, as shown in FIG. 17, however such need not be the case, as shown in FIG. 18.

General Considerations

Throughout the disclosure, the glass-polymer laminate may be in the form of a sheet (of any desired shape) or a ribbon, as may be the glass used in the laminate.

Each of the polymer layers (either the above-described polymer layers 20 and 30, or the polymer layers described below in connection with impact loading, hereinafter referred to as polymer layers for ease in description only) may include various polymers, for example, any one or more of polyethylene teraphthalate (PET), polyethylene Naphthalate (PEN), ethylene tetrafluoro ethylene (ETFE), or thermopolymer polyolefin (TPO™—polymer/filler blends of polyethylene, polypropylene, block copolymer polypropylene (BCPP), or rubber), polyesters, polycarbonate, polyvinylbuterate, polyethylene and substituted polyethylenes, polyhydroxybutyrates, polyhydroxyvinylbutyrates, polyetherimides, polyamides, polyethylenenaphalate, polyimides, polyethers, polysulphones, polyvinylacetylenes, transparent thermoplastics, transparent polybutadienes, polycyanoacrylates, cellulose-based polymers, polyacrylates and polymethacrylates, polyvinylalcohol, polysulphides and polysiloxanes. It is also possible to use polymers which can be deposited/coated as pre-polymers or pre-compounds and then converted, such as epoxy-resins, polyurethanes, phenol-formaldehyde resins, and melamine-formaldehyde resins. The polymer layers may be transparent for some applications, but need not be for other applications.

Additionally, each of the polymer layers may itself be a laminated or composite structure made of different types of polymer having different Young's moduli, different Poisson's Ratios, and/or layer thicknesses. In this case, one of skill in the art would be able to homogenize the compound layer to find effective values for the overall layer, including an effective thickness, an effective Young's modulus, and an effective Poisson's Ratio that may be used as described herein to beneficially configure a glass-polymer laminate.

The glass-polymer laminate described herein may be used as a substrate for mounting device-functional layers, or may be used as an encapsulant layer within the device. The device may be an electronic device, for example, a display screen (including a Liquid Crystal Display, a Plasma Display, an Organic Light Emitting Diode display, flat panel display, for example), a lighting-emitting device, a solar cell module. The functional layers may include, for example, thin film transistors (TFTs), diodes, photodiodes, triodes, photovoltaic cells, photocouplers, transparent electrodes, color filter, electroconductive layer. The glass-polymer laminate may be used as a cover laminated onto the display screens, for example, those noted above.

The glass-polymer laminate may be a substantially transparent formable and/or flexible structure for use as a protective element in an electronic device, wherein the glass-polymer laminate is a composite structure comprising a layer of glass of a thickness from 5 to 500 microns, and a layer of polymer ranging in thickness from 1 to 2000 microns. In this connection the formability of the glass-polymer laminate allows it to deviate from full planarity by bending and/or twisting so it can adapt to the shape or form of some other object. Its flexibility allows it to be bent without detrimentally affecting its barrier properties.

The electronic device may be an organic light-emitting device Other electronic devices include thin film transistors (TFTs), diodes, photodiodes, triodes, photovoltaic cells and photocouplers.

The glass-polymer laminate can constitute a substrate for an electronic device and, as such, can be coated with a transparent electrode layer. That layer would normally be the anode and is preferably of indium tin oxide. In that case, the electrode coating is applied to one surface of the glass layer. As an alternative, the glass-polymer laminate may constitute an encapsulation film for a light-emitting, or other electronic, device.

In order to form the structure in which the glass-polymer laminate constitutes a substrate for the organic light-emitting device, the glass layer may be precoated with a transparent electrode layer prior to attachment to the polymer layer, or the transparent electrode layer may be deposited after fabrication of the glass-polymer laminate. It is also possible to reverse the order of layers in the glass-polymer laminate so that the polymer layer constitutes the inner layer carrying the electrode layer and the outer layer constitutes the glass layer.

The electronic device with the glass-polymer laminate can be manufactured in a sequence of integrated steps which include the construction of the glass-polymer laminate, deposition of the transparent electrode layer, deposition of the or each electrically active layer and deposition of the second electrode layer. A batch, semi-continuous or continuous process can be considered for the manufacture of the complete device. A further encapsulation layer on the second electrode layer can be provided.

Various techniques for manufacturing the glass-polymer laminate are possible in accordance with different embodiments.

According to one embodiment, a polymer layer carrying a coating of a first transparent electrode (e.g. ITO) is provided. Then, at least one layer of an electrically active, e.g. electroluminescent, organic material is deposited followed by the second electrode layer. The complete structure is then laminated to the glass layer.

According to another embodiment, the polymer and glass layers are exchanged in the preceding sequence.

According to a further embodiment, the glass-polymer laminate is prefabricated and is then used as the basis for deposition of the first electrode layer, the at least one layer of an electrically active material and the second electrode layer.

If the glass layer is used as the "outer layer", that is with the polymer layer adjacent the first electrode layer and within the glass layer, it is important to remove (for example by out-gassing, baking-out or pumping-out) impurities (for example oxygen, water and possible other low molecular weight compounds) which may be present in the substrate.

The glass and polymer layers can be provided in sheet form according to a batch process.

Alternatively, the glass layer can be provided in sheet form and the polymer layer from a continuous roll.

As a further possibility, both glass and polymer layers are from continuous rolls.

The composite structure can be formed by lamination of the glass and polymer layers, e.g. according to a batch process, a continuous roll-to-roll process or a semi-continuous process whereby the polymer layer is a continuous film and the glass layer is in sheet form.

For the polymer layer, it is possible to use polymers which can be deposited/coated as pre-polymers or pre-compounds and then converted, such as epoxy-resins, polyurethanes, phenol-formaldehyde resins, and melamine-formaldehyde resins.

The lamination of the glass and polymer layers can be with glue/adhesive in between the two layers. In that case, glue can be pre-coated onto one of the two or on both substrates; or supplied during the lamination process, at room or elevated temperature and with or without pressure. UV-cured glues are also suitable.

The polymer layer can be in the from of polymer sheets which are pre-coated with a heat-seal glue.

Lamination and/or deposition of the polymer layer onto the glass layer can be integrated in the fabrication process of the glass, i.e. glass comes off the fabrication line and is then (still hot or warm or cold) coated with the polymer.

As an alternative to formation by lamination, the polymer layer of the composite is coated onto the glass layer by a batch or continuous process. Coating of the polymer onto the glass can be by dip, spray, solution-spin, solution-blade, meniscus coating, or by coating of a molten polymer onto the glass layer.

That is, it is possible to consider the different situations (i) where polymer exists already as film and is laminated to the glass and (ii) where polymer is not in film form but is coated onto the glass by dip, spray, etc. etc. The pre-polymers mentioned above, for example, are amenable to case (ii). However, also several of the other polymers mentioned above can be coated for case (ii). In this instance the polymers can be coated onto the glass principally by: coating from solution, from a melt or as pre-polymer.

The glass-polymer laminate may be used as a substrate/encapsulant not only for OLEDs (small molecule fluorescence (SMF) and (LEP) light emitting polymers) but for other devices including an electrically active layer e.g. organic photo-detectors, organic solar-cells, thin-film-transistor (TFT) arrays and TFTs for OLEDs. Another use is for LEP products such as un-patterned backlights and other light sources or patterned devices such as signs, alpha-numeric displays or dot-matrix and other high-resolution displays.

In manufacture of an electronic device, it is usually necessary to subject some or all of the layers to processing steps. For example, if there is present an electroluminescent organic material that is a semiconductive conjugated polymer such as poly(phenylene vinylene) (PPV) then the deposition of that layer would normally take place by depositing a precursor to the polymer in a solvent, for example by spin-coating, and then subjecting that layer to a subsequent processing step to convert the precursor to the final polymer. Thus, the underlying glass-polymer laminate, if present during these processing steps, must be able to withstand the solvents used for spin-coating the precursor layer and the subsequent temperatures used for driving off the solvent and converting the precursor to the polymer. Thus, the polymer layer of the glass-polymer laminate needs to be of appropriate qualities. For example, if the glass-polymer laminate is to be subjected to high temperatures, then the glass-transition temperature of the polymer layer should be above those temperatures. For example, a temperature of in excess of 150.degree. C. is possible. Moreover, in certain situations, the polymer layer should be resistant to the solvent layers used for the polymers, such as mixed xylene, THF, used for soluble conjugated polymers such as MEH PPV.

The glass-polymer laminate can comprise more than two layers. For example, the composite structure can comprise a glass layer and two polymer layers.

In particular, a composite structure can comprise a polymer/glass/polymer composite with a coating of ITO on the outer surface of one of the polymer layers. Such a structure would be beneficial in a situation where there was a significant difference in the expansion coefficients of the glass layer and polymer layer, such that a bending of the glass-polymer laminate may take part. This would be prevented if an additional layer was incorporated.

Additional functionality can be incorporated into the polymer layer. For example, the polymer layer can comprise a polymer polarizer sheet, a contrast-enhancing filter-laminate, have anti-reflective properties, color filter properties or color conversion properties. For example, it would be possible to have a device in which the light emitting layer emits blue light and in which the laminate contains, for example, red or green fluorescent molecules which absorb the blue and re-emit in the red or green. Alternatively or additionally, the polymer layer can be designed to block undesired ambient light and/or have scattering particles so that wave guiding is reduced and the brightness of the device is increased. Such additional functionalities could be incorporated in the glass layer. Where a third polymer layer is provided in the composite structure, this allows the possibility of two different types of polymer layers, providing the possibility for incorporating different additional functionalities into the different layers.

Impact Loading

The above-described glass-polymer laminate considerations and configurations may also be useful in designing the laminate to withstand impact loading, wherein the surface defect population is placed under tensile stress in two axial planes by a dynamic impact. Ball drop testing, e.g. as done during product qualification, often serves as a surrogate for impact loading. A modeling study of dynamic impact loading on a glass-polymer laminate was performed using the following assumptions (applicable throughout the discussion of FIGS. 19-22):

sample size of glass and/or glass-polymer laminate was 300×300 mm, with the outer 25.4 mm on all four sides clamped;

$E_g$=73.6 GPa;

$v_g$=0.23;

glass density=2.38×10$^3$ kg/m$^3$;

polymer coating #1: E=3 GPa; v=0.3; density=1.4×10$^3$ kg/m$^3$;

polymer coating #2: E=6 GPa; v=0.3; density=1.4×10$^3$ kg/m$^3$;

polymer coating #3: E=9 GPa; v=0.3; density=1.4×10$^3$ kg/m$^3$;

polymer coating #4: E=12 GPa; v=0.3; density=1.4×10$^3$ kg/m$^3$; and the ball is dropped onto the glass side of a bi-layer glass-polymer laminate.

Figure 19:
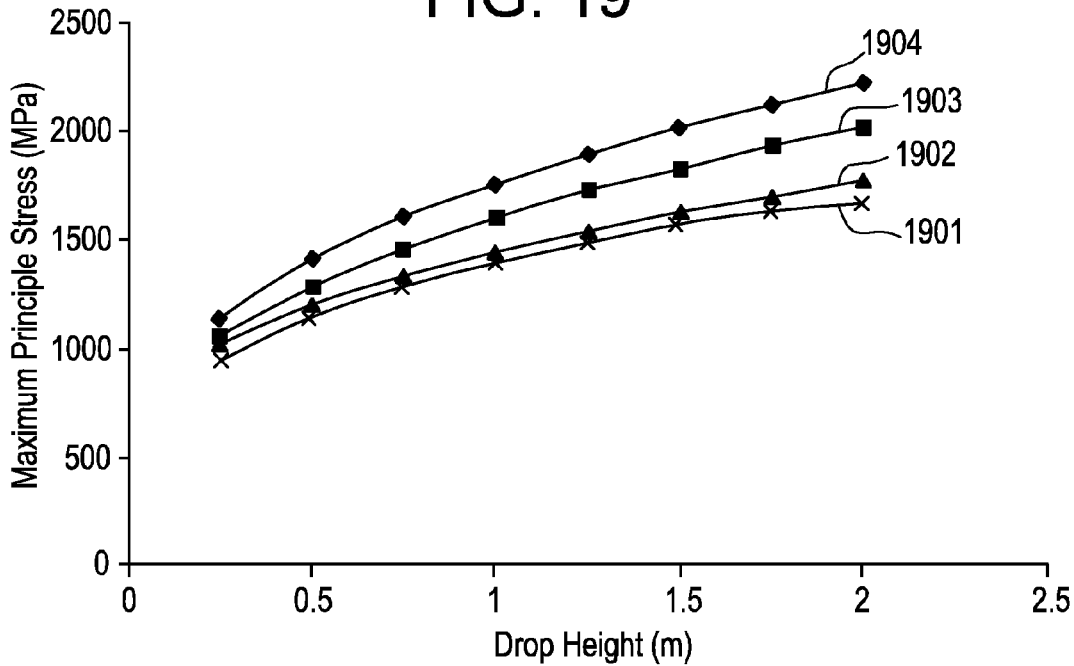
FIG. 19 is a graph of maximum principle stress as a function of ball-drop height and ball mass.

The maximum principle stress of a dynamic impact event is a function of object mass, shape and drop height. FIG. 19 shows a family of curves for various ball masses dropped at different heights onto a bare glass sample having a thickness of 100 microns, and shows maximum principle stress in MPa as a function of drop height in meters. More particularly: curve 1901 is for a ball mass of 32 g; curve 1902 is for a ball mass of 64 g; curve 1903 is for a ball mass of 128 g; curve 1904 is for a ball mass of 256 g. As can be seen from this figure, for a given drop height, the maximum principle stress increases as ball weight increases. Similarly, for a given ball mass, the maximum principle stress increases as ball drop height increases. As a practical matter, a standard test for a particular product may specify a maximum impact energy (including ball weights, drop heights, and/or diameters) that the product must withstand in order to meet the standard. For example, IEC 61646 (Thin Film terrestrial PV modules—Design Qualification and Type Approval) and UL 1703 (Flat-Plate PV Modules and Panels) are standards that require some form of impact testing via a ball drop experiment. Thus, because the curves 1901 to 1904 set forth a similar relationship (i.e., maximum principle stress increases with increasing impact energy), the design principles discussed below will apply to designing glass-polymer laminates so as to meet a variety of impact energy tests as set forth in various standards.

Figure 20:
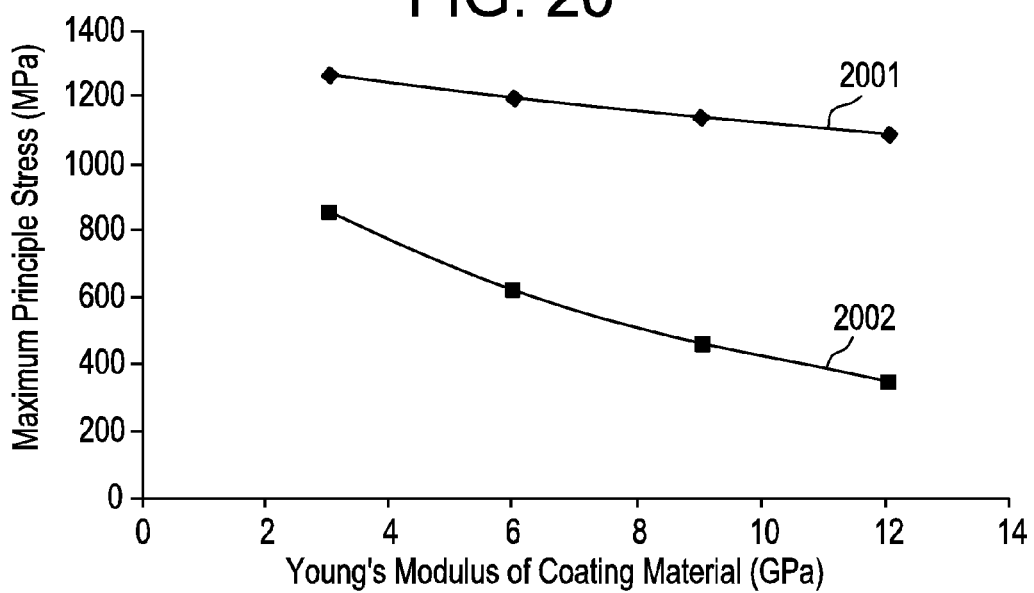
FIG. 20 is a graph of maximum principle stress as a function of polymer Young's modulus and polymer thickness.

The above-noted maximum principle stresses exemplified in FIG. 19 can be reduced for a particular set of product requirements. For example, as shown in FIG. 20, the maximum principle stress in the glass (as would be imparted by an impact load) can be reduced by increasing the Young's modulus of a polymer layer laminated therewith and/or by increasing the thickness of the polymer layer. More particularly, FIG. 20 is a plot of maximum principle stress (as would be imparted by a ball of 32 g dropped from a height of 1 meter onto the glass side of a bi-layer glass-polymer laminate) versus Young's modulus of the polymer layer in the glass-polymer laminate, wherein tg=100 microns. Curve 2001 is the case for a polymer thickness tp=100 microns, whereas curve 2002 is the case for a polymer thickness tp=300 microns. As can be seen from curve 2001, for a given impact load and polymer layer thickness, the maximum principle stress would be reduced as the Young's modulus of the polymer layer increases (shown are four points corresponding to polymer coatings #1-4 described above). Curve 2002 shows a similar relationship. Further, comparing curve 2002 to 2001, it can be seen that for a given impact load and Young's modulus of the polymer layer, the maximum principle stress would be reduced as the polymer layer thickness increases, i.e., as the thickness is increased from curve 2001 to that of curve 2002. Accordingly, if the given design criteria are glass thickness and Young's modulus of the polymer layer, a suitable polymer layer thickness can be chosen to meet a required maximum principle stress (this maximum principle stress may be one that is expected during use of the product, or one as specified by a standard, for sake of ease in explanation this is simply referred to hereafter as required maximum principle stress; further, the maximum principle stress may be derated to provide a factor of safety as discussed below—and this is assumed to be the case for maximum principle stress in the other situations discussed herein, although not particularly mentioned in each case so as to simplify the description). Similarly, if the given design criteria are glass thickness and polymer layer thickness, a suitable polymer layer material (i.e., one having a suitable Young's modulus) can be chosen to meet a required maximum principle stress.

Figure 21:
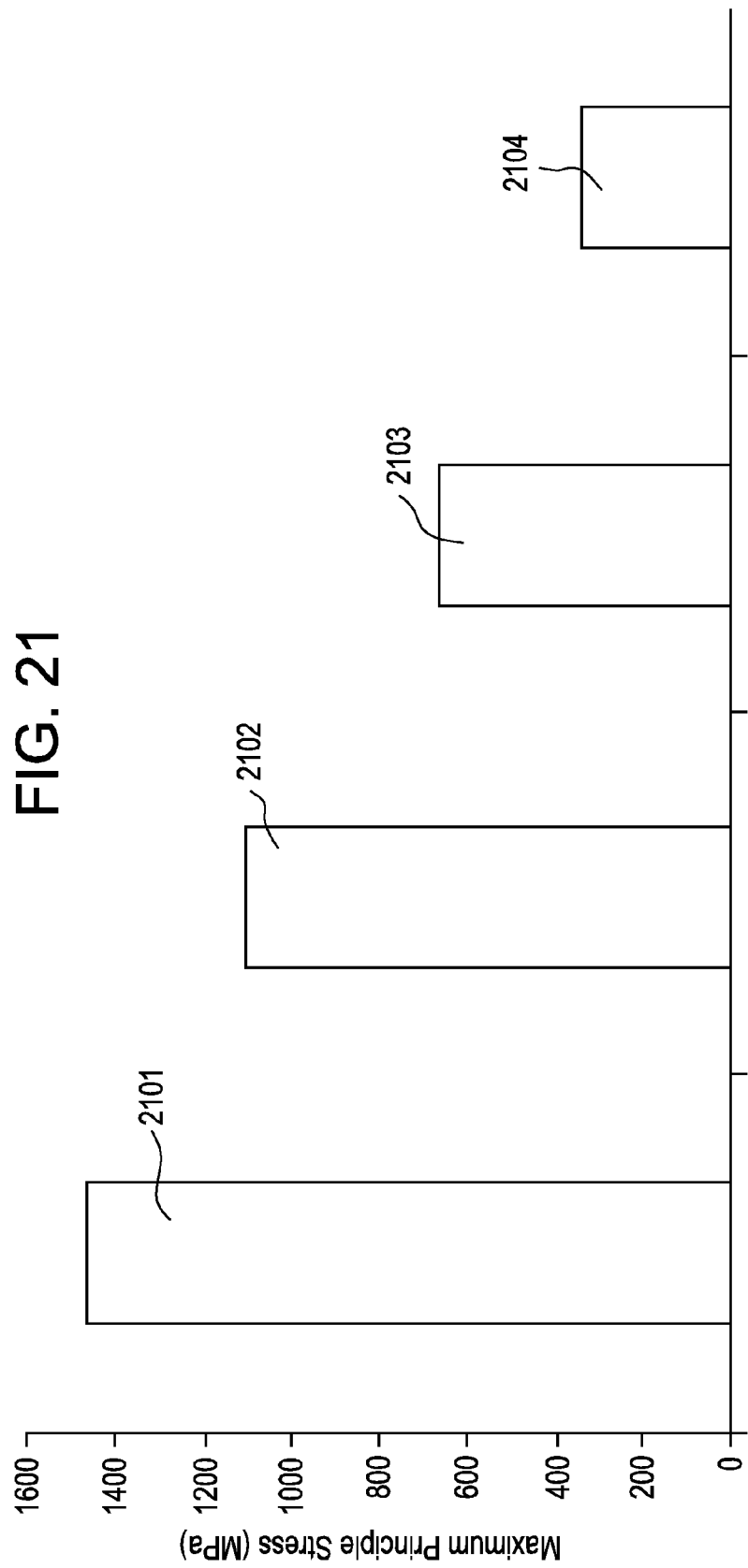
FIG. 21 is a graph of maximum principle stress as a function of polymer thickness and polymer Young's modulus, as predicted for an impact energy of 2 Joules.

FIG. 21 shows a comparison of the maximum principle stress values that would be imparted by a 500 g ball (having a diameter of 50 mm) when dropped from a 0.41 meter height onto glass and the glass side of various bi-layer glass-polymer laminates. The ball would impart an energy of 2 Joules to the substrate. More particularly, bar 2101 shows the case for a bare glass substrate having a thickness tg=100 microns; bar 2102 shows the case for a bi-layer glass-polymer laminate, wherein the thickness of the glass tg=100 microns, the polymer layer thickness tp=500 microns, and the polymer layer has the properties of polymer coating #1 (notably, Ep=3 GPa); bar 2103 shows the case for a glass-polymer laminate, wherein the thickness of the glass tg=100 microns, the polymer layer thickness tp=1000 microns, and the polymer layer has the properties of polymer coating #1 (notably, Ep=3 GPa); and bar 2104 shows the case for a glass-polymer laminate, wherein the thickness of the glass tg=100 microns, the polymer layer thickness tp=1000 microns, and the polymer layer has the properties of polymer coating#4 (notably, Ep=12 Gpa).

By comparing bar 2101 with any one of bars 2102-2104, it is seen that for a given glass thickness, maximum principle stress can be reduced by a polymer layer laminated to the glass. Accordingly, if glass thickness was a given design criteria, a suitable polymer layer could be chosen as a laminate so that the glass would withstand a required maximum stress.

By comparing bar 2102 with 2103, it is seen that for a given glass thickness and polymer layer material properties, the maximum principle stress in the glass would be reduced by increasing the polymer layer thickness. Accordingly, if one had a glass thickness and polymer layer properties given as design criteria, a suitable polymer layer thickness could be chosen so as to meet a required maximum principle stress.

By comparing bar 2103 with 2104, it is seen that for a given glass thickness and polymer layer thickness, the maximum principle stress in the glass would be reduced by increasing the polymer layer Young's modulus. Accordingly, if one had a glass thickness and polymer layer thickness given as design criteria, a suitable polymer layer Young's modulus could be chosen so as to meet a required maximum principle stress.

Figure 22:
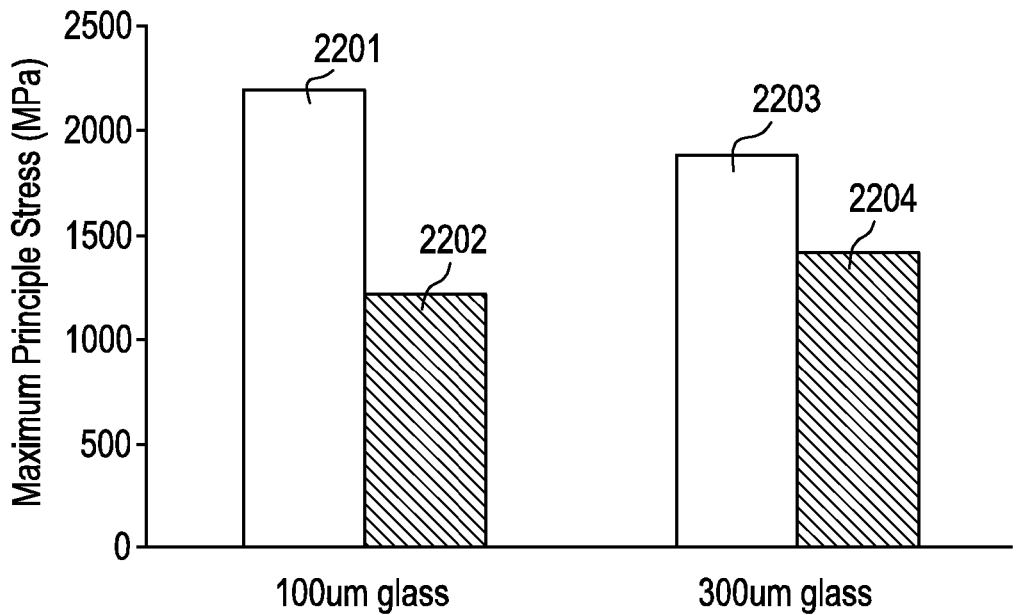
FIG. 22 is a graph of maximum principle stress as a function of glass thickness and polymer thickness, as predicted for an impact energy of 6.78 Joules.

FIG. 22 shows that the above-described results are not limited to glass thicknesses of 100 microns, but that thicker glass may also achieve a reduced maximum principle stress by including it in a glass-polymer laminate. More particularly, FIG. 22 shows the case for a 535 g ball (diameter of 51 mm) dropped onto the glass surface from a height of 1.295 m, which achieves an imparted energy of 6.78 Joules), wherein: bar 2201 shows the case for an uncoated glass having a thickness of 100 microns; bar 2202 shows the case for a bi-layer glass-polymer laminate having a glass thickness of 100 microns and a polymer layer having a thickness tp=1000 microns as well as properties of polymer coating #4 (notably, Ep=12 GPa); bar 2203 shows the case for an uncoated glass having a thickness of 300 microns; bar 2204 shows the case for a bi-layer glass-polymer laminate having a glass thickness of 300 microns and a polymer layer having a thickness tp=1000 microns as well as properties of polymer coating #4 (notably, Ep=12 GPa).

By comparing bar 2201 with 2202, it is seen that the maximum principle stress in 100 micron thick glass would be reduced by having a polymer layer laminated therewith. Similarly, by comparing bar 2203 with 2204, it is seen that the maximum principle stress in a thicker, i.e., 300 micron thick, glass is also reduced by having a polymer layer laminated therewith. Accordingly, the concepts of designing a glass-polymer laminate to withstand a particular required maximum principle stress, e.g., by varying polymer layer thickness and/or properties, can be applied to a variety of glass thicknesses.

For the above discussion, it should be noted that the value of maximum principle stress from modeling is for relative comparison purposes only, because the actual value of the maximum principle stress would depend upon the mesh size, or pitch between sample points, and upon the boundary conditions, i.e., the manner in which the sample would be held. During an impact event of a glass-polymer laminate used in a mobile device, for example, the side opposite the impact would usually be the tensile side.

Stress Derating

The inherent mechanical reliability characteristics of glass can be preserved through proper stress management. One technique for adjusting the required maximum principle stress is to apply a safety factor through stress derating. It is the ratio of the applied stress to the inherent strength of the material. The lower the ratio applied to the design, the higher the probability of assuring long term reliability. It is a design attribute that will affect the selection, thickness and location(s) of a polymer layer in the glass-polymer laminate structure.

Figure 23:
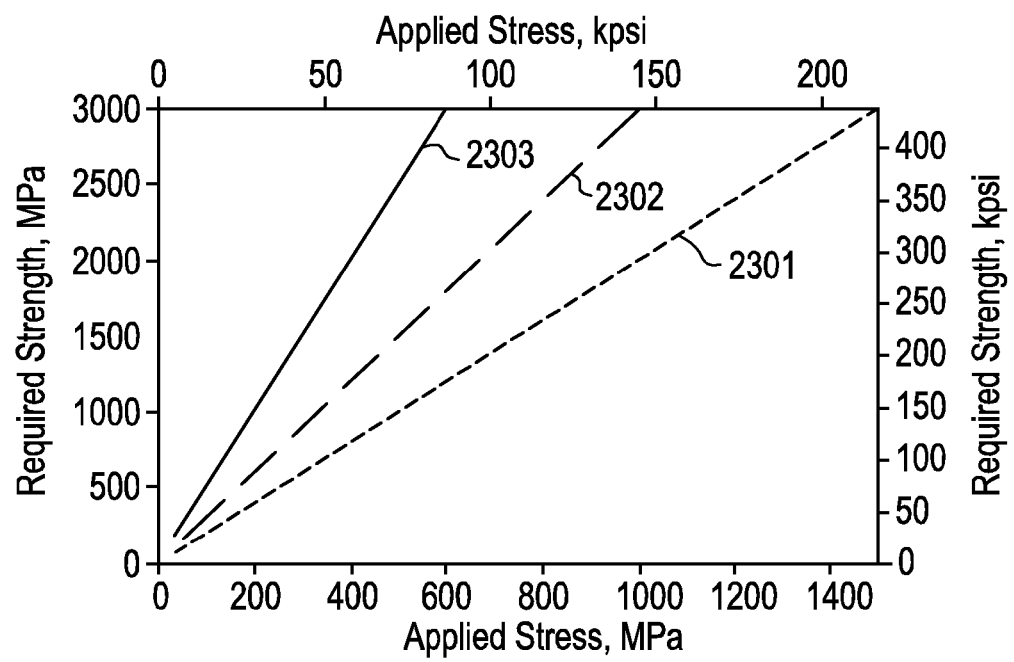
FIG. 23 is a glass derating graph showing the applied stress relative to the required strength relationships for various product reliability timeframes.

FIG. 23 is a glass derating graph showing the applied stress relative to the required strength relationships for various product reliability timeframes. More particularly: line 2301 shows a timeframe of seconds; line 2302 shows a time frame of hours; and line 2303 shows a timeframe of years. That is, for example, for a required maximum principle applied stress of 200 MPa, if that applied stress was expected to last for a matter of: seconds, the required strength would be less than 500 MPa; hours, the required strength would be greater than 500 MPa; years, the required strength would be about 1000 MPa. Thus, it is seen that the longer the stress is applied, the higher the strength requirement for the glass. Conversely, for example, if glass had a strength of 1000 MPa, it would be able to withstand a maximum principle applied stress: of about 200 MPa for a matter of years; of less than 400 MPa for a matter of hours; and of greater than 400 MPa for a matter of seconds.

CONCLUSION

It should be emphasized that the above-described embodiments of the present invention, particularly any "preferred" embodiments, are merely possible examples of implementations, merely set forth for a clear understanding of various principles of the invention. Many variations and modifications may be made to the above-described embodiments of the invention without departing substantially from the spirit and various principles of the invention. All such modifications and variations are intended to be included herein within the scope of this disclosure and the present invention and protected by the following claims.

What is claimed is:

1. A laminate comprising:
a glass sheet having a thickness of from 5 to 500 microns, wherein the laminate is curved so that a first surface of the glass sheet is disposed in a convex shape and a second surface of the glass sheet is disposed in a concave shape;
a first polymer laminated to the first surface of the glass sheet, the first polymer providing a coating factor (F) to the first surface of the glass sheet, wherein the coating factor (F) is less than 1 and is defined by the following formula $$F=(1-\gamma\beta^2)/(1+\gamma\beta), \text{ wherein}$$

$\gamma=[Ep1(1-vg^2)]/[Eg(1-vp1^2)]$,
$\beta=tp1/tg$,
Ep1=Young's Modulus of the first polymer,
tp1=thickness of the first polymer,
vp1=Poisson's Ratio of the first polymer,
Eg=Young's Modulus of the glass,
tg=thickness of the glass, and
vg=Poisson's Ratio of the glass.

2. The laminate of claim 1, wherein $\beta$ is from 0.002 to 400, and wherein $\gamma$ is from 0.001 to 0.1.

3. The laminate of claim 1, wherein Eg is from 50 to 95 GPa.

4. The laminate of claim 1, wherein Ep1 is from 10 to 9500 MPa.

5. A laminate comprising:
a glass sheet having a first surface, a second surface, and a thickness of from 5 to 500 microns;
a first polymer layer laminated to the first surface of the glass sheet, the first polymer layer having a first Young's Modulus (Ep1), a first thickness (tp1), and a first Poisson's ratio (vp1);
a second polymer layer laminated to the second surface of the glass sheet, the second polymer layer having a second Young's Modulus (Ep2), a second thickness (tp2), and a second Poisson's Ratio (vp2);
wherein the glass sheet is curved so that the second surface is disposed in a concave shape; and
further wherein the first polymer layer and the second polymer layer are configured so that $$[(Ep1tp1(1+tp1))/(1-vp1^2)]>[(Ep2tp2(1+tp2))/(1-vp2^2)].$$

6. The laminate of claim 5, wherein a polymer of the second polymer layer is the same as a polymer of the first polymer layer, and wherein the second polymer layer has a different thickness than a thickness of the first polymer layer.

7. The laminate of claim 5, wherein the second polymer layer comprises different polymers, and wherein Ep2, tp2, and vp2, are homogenized values for the different polymers and are representative of the second polymer layer.

8. The laminate of claim 5, wherein the glass sheet has a thickness of from 25 to 400 microns.

9. An electronic device comprising
a housing
a glass-polymer laminate portion coupled to the housing, wherein the glass-polymer laminate portion comprises a laminate according to claim 1.

10. The device of claim 9, wherein the housing has an inside and an outside, and further wherein the second surface of the glass sheet is disposed so as to face the outside of the housing.

11. The device of claim 9, wherein the housing is curved in a manner complementary to that of the glass-polymer laminate.

12. A method of conveying a glass-polymer laminate, the glass-polymer laminate having a first side and a second side, the glass-polymer laminate being either a structure having a first polymer layer on the first side and glass on the second side, or a structure having a first polymer layer on the first side and a second polymer layer on the second side with glass therebetween, comprising:
conveying the glass-polymer laminate about a first roller having a diameter D1, wherein the second side of the glass-polymer laminate is disposed so as to face toward the first roller;
conveying the glass-polymer laminate about a second roller having a diameter D2, wherein the first side of the glass-polymer laminate is disposed so as to face toward the second roller; and
wherein D1<D2,
and further wherein when the glass-polymer laminate has a first polymer layer on the first side and a second polymer layer on the second side:
the first polymer layer has a first Young's Modulus (Ep1), a first thickness (tp1), and a first Poisson's ratio (vp1);
the second polymer layer has a second Young's Modulus (Ep2), a second thickness (tp2), and a second Poisson's Ratio (vp2); and
the first polymer layer and the second polymer layer are configured so that $[(Ep1 tp1(1+tp1))/(1-vp1^2)] > [(Ep2 tp2(1+tp2))/(1-vp2^2)]$.

13. The method of claim 12, wherein the second polymer layer comprises different polymers, and wherein Ep2, tp2, and vp2, are homogenized values for the different polymers and are representative of the second polymer layer.

14. The method of claim 12, wherein the first polymer layer comprises different polymers, and wherein Ep1, tp1, and vp1, are homogenized values for the different polymers and are representative of the first polymer layer.

15. The laminate of claim 1, wherein the coating factor (F) is less than 0.

16. The laminate of claim 1, wherein the glass sheet has a thickness of from 25 to 400 microns.

17. The electronic device of claim 9, wherein the coating factor (F) is less than 0.

* * * * *